United States Patent
Smith et al.

(10) Patent No.: US 11,300,884 B2
(45) Date of Patent: Apr. 12, 2022

(54) ILLUMINATION SYSTEM WITH CURVED 1D-PATTERNED MASK FOR USE IN EUV-EXPOSURE TOOL

(71) Applicant: Nikon Corporation, Tokyo (JP)

(72) Inventors: Daniel Gene Smith, Tucson, AZ (US); David M. Williamson, Tucson, AZ (US); Donis G. Flagello, Half Moon Bay, CA (US); Michael B. Binnard, Belmont, CA (US)

(73) Assignee: Nikon Corporation, Tokyo (JP)

(*) Notice: Subject to any disclaimer, the term of this patent is extended or adjusted under 35 U.S.C. 154(b) by 0 days.

(21) Appl. No.: 16/679,052

(22) Filed: Nov. 8, 2019

(65) Prior Publication Data

US 2020/0073251 A1 Mar. 5, 2020

Related U.S. Application Data

(63) Continuation of application No. PCT/US2018/031796, filed on May 9, 2018, which is
(Continued)

(51) Int. Cl.
*G03F 7/20* (2006.01)
*G02B 17/06* (2006.01)

(52) U.S. Cl.
CPC ....... *G03F 7/70233* (2013.01); *G02B 17/061* (2013.01); *G03F 7/702* (2013.01); *G03F 7/70033* (2013.01); *G03F 7/70316* (2013.01)

(58) Field of Classification Search
CPC ............. G03F 7/70033; G03F 7/70058; G03F 7/70075; G03F 7/70116; G03F 7/702;
(Continued)

(56) References Cited

U.S. PATENT DOCUMENTS

| 3,884,573 A | 5/1975 | Franklin |
| 4,924,257 A | 5/1990 | Jain |

(Continued)

FOREIGN PATENT DOCUMENTS

| CN | 102754009 A | 10/2012 |
| CN | 103309168 A | 9/2013 |

(Continued)

OTHER PUBLICATIONS

Ceglio et al., "Front-end design issues in soft-x-ray projection lithography," *Applied Optics*, 32:7050-7056 (Dec. 1, 1993).
(Continued)

*Primary Examiner* — Mesfin T Asfaw
(74) *Attorney, Agent, or Firm* — Klarquist Sparkman, LLP

(57) ABSTRACT

A catoptric system having a reference axis and including a reflective pattern-source (carrying a substantially one-dimensional pattern) and a combination of two optical reflectors disposed sequentially to transfer EUV radiation incident onto the first optical component to the pattern-source the substantially one-dimensional pattern of which is disposed in a curved surface. In one case, such combination includes only two optical reflectors (each may contain multiple constituent components). The combination is disposed in a fixed spatial and optical relationship with respect to the pattern-source, and represents an illumination unit (IU) of a 1D EUV exposure tool that additionally includes a projection optical sub-system configured to form an optical image of the pattern-source on an image plane with the use of only two beams of radiation. These only two beams of radiation originate at the pattern-source from the EUV radiation transferred onto the pattern-source.

46 Claims, 26 Drawing Sheets

Related U.S. Application Data a continuation-in-part of application No. 15/599,148, filed on May 18, 2017, and a continuation-in-part of application No. 15/599,197, filed on May 18, 2017, and a continuation-in-part of application No. PCT/US2018/027785, filed on Apr. 16, 2018, and a continuation-in-part of application No. PCT/US2018/029160, filed on Apr. 24, 2018.

(60) Provisional application No. 62/504,908, filed on May 11, 2017.

(58) Field of Classification Search
CPC .... G03F 7/70191; G03F 7/70283; G03F 1/22; G03F 7/20; G03F 1/24; G03F 7/70091; G03F 7/7005; G03F 7/70108; G03F 7/7015; G03F 7/70625; G03F 7/2008; G03F 1/52; G03F 7/2022; G03F 7/701; G03F 7/70125; G03F 7/70141; G03F 7/70216; G03F 7/7025; G03F 7/70275; G03F 7/70233; G03F 7/70316; G02B 17/061; G02B 17/0892; G02B 17/0663
See application file for complete search history.

(56) References Cited

U.S. PATENT DOCUMENTS

| | | |
|---|---|---|
| 5,003,567 A | 3/1991 | Hawryluk et al. |
| 5,144,363 A | 9/1992 | Wittekoek et al. |
| 5,212,588 A | 5/1993 | Viswanathan et al. |
| 5,477,304 A | 12/1995 | Nishi |
| 5,623,853 A | 4/1997 | Novak et al. |
| 5,668,672 A | 9/1997 | Oomura |
| 5,689,377 A | 11/1997 | Takahashi |
| 5,835,275 A | 11/1998 | Takahashi et al. |
| 5,854,671 A | 12/1998 | Nishi |
| 5,874,820 A | 2/1999 | Lee |
| 5,892,117 A | 4/1999 | Theriot |
| 6,014,421 A | 1/2000 | Chiba et al. |
| 6,198,793 B1 | 3/2001 | Schultz et al. |
| 6,331,710 B1 | 12/2001 | Wang et al. |
| 8,223,345 B2 | 7/2012 | Hidaka et al. |
| 8,411,249 B2 | 4/2013 | Hidaka et al. |
| 8,502,978 B2 | 8/2013 | Hidaka |
| 8,599,387 B2 | 12/2013 | Hidaka |
| 8,705,170 B2 | 4/2014 | Williamson et al. |
| 2002/0093636 A1 | 7/2002 | Komatsuda |
| 2004/0165169 A1 | 8/2004 | Teunissen et al. |
| 2004/0256575 A1 | 12/2004 | Singer et al. |
| 2008/0151211 A1 | 6/2008 | Kaiser et al. |
| 2009/0130569 A1 | 5/2009 | Quesnel |
| 2009/0257042 A1 | 10/2009 | Komatsuda |
| 2009/0268182 A1 | 10/2009 | Staals et al. |
| 2010/0053584 A1 | 3/2010 | Kajiyama et al. |
| 2011/0013162 A1 | 1/2011 | Kiuchi et al. |
| 2011/0071784 A1 | 3/2011 | Smith et al. |
| 2012/0008150 A1 | 1/2012 | Smith et al. |
| 2012/0287414 A1 | 11/2012 | Fiolka et al. |
| 2013/0070227 A1 | 3/2013 | Mueller et al. |
| 2013/0188084 A1 | 7/2013 | Goodwin |
| 2013/0244139 A1 | 9/2013 | Liu et al. |
| 2013/0258305 A1 | 10/2013 | Johnson |
| 2013/0308140 A1 | 11/2013 | Goodwin et al. |
| 2013/0330662 A1 | 12/2013 | Goodwin |
| 2014/0049761 A1 | 2/2014 | Goodwin et al. |
| 2014/0218713 A1 | 8/2014 | Lu et al. |
| 2014/0233011 A1 | 8/2014 | Goodwin et al. |
| 2014/0253892 A1 | 9/2014 | Yu et al. |
| 2014/0268086 A1 | 9/2014 | Lu et al. |
| 2015/0049321 A1 | 2/2015 | Bieling et al. |
| 2016/0033866 A1 | 2/2016 | Lu et al. |
| 2016/0313646 A1 | 10/2016 | Dinger et al. |

FOREIGN PATENT DOCUMENTS

| | | |
|---|---|---|
| CN | 103969962 A | 8/2014 |
| CN | 104335096 A | 2/2015 |
| JP | 2001027699 | 1/2001 |
| WO | WO 2012/177663 | 12/2012 |
| WO | WO 2013/174644 A1 | 11/2013 |
| WO | WO 2017/199096 | 11/2017 |

OTHER PUBLICATIONS

International Preliminary Report on Patentability from International Application No. PCT/US2018/027785, dated Oct. 22, 2019, 22 pages.
International Preliminary Report on Patentability from International Application No. PCT/US2018/029160, dated Oct. 29, 2019, 17 pages.
International Search Report from International Application No. PCT/US2012/043186, dated Sep. 14, 2012, 3 pages.
International Search Report and Written Opinion from International Application No. PCT/US2018/027785, dated Jan. 4, 2019, 28 pages.
International Search Report and Written Opinion from International Application No. PCT/US2018/029160, dated Oct. 17, 2018, 23 pages.
International Search Report and Written Opinion from International Application No. PCT/US2018/031796, dated Jan. 2, 2019, 26 pages.
Non-final Office action from U.S. Appl. No. 15/629,353, dated Jun. 20, 2018, 15 pages.
International Preliminary Report on Patentability from International Application No. PCT/US2018/031796, dated Nov. 12, 2019, 21 pages.
Office Action issued in Chinese Patent Application No. 201880027134.9, dated Apr. 23, 2021, 9 pages (with English translation, 9 pages).
Office Action issued in Chinese Patent Application No. 201880030036.0, dated Jun. 23, 2021, 12 pages (with English translation, 17 pages).

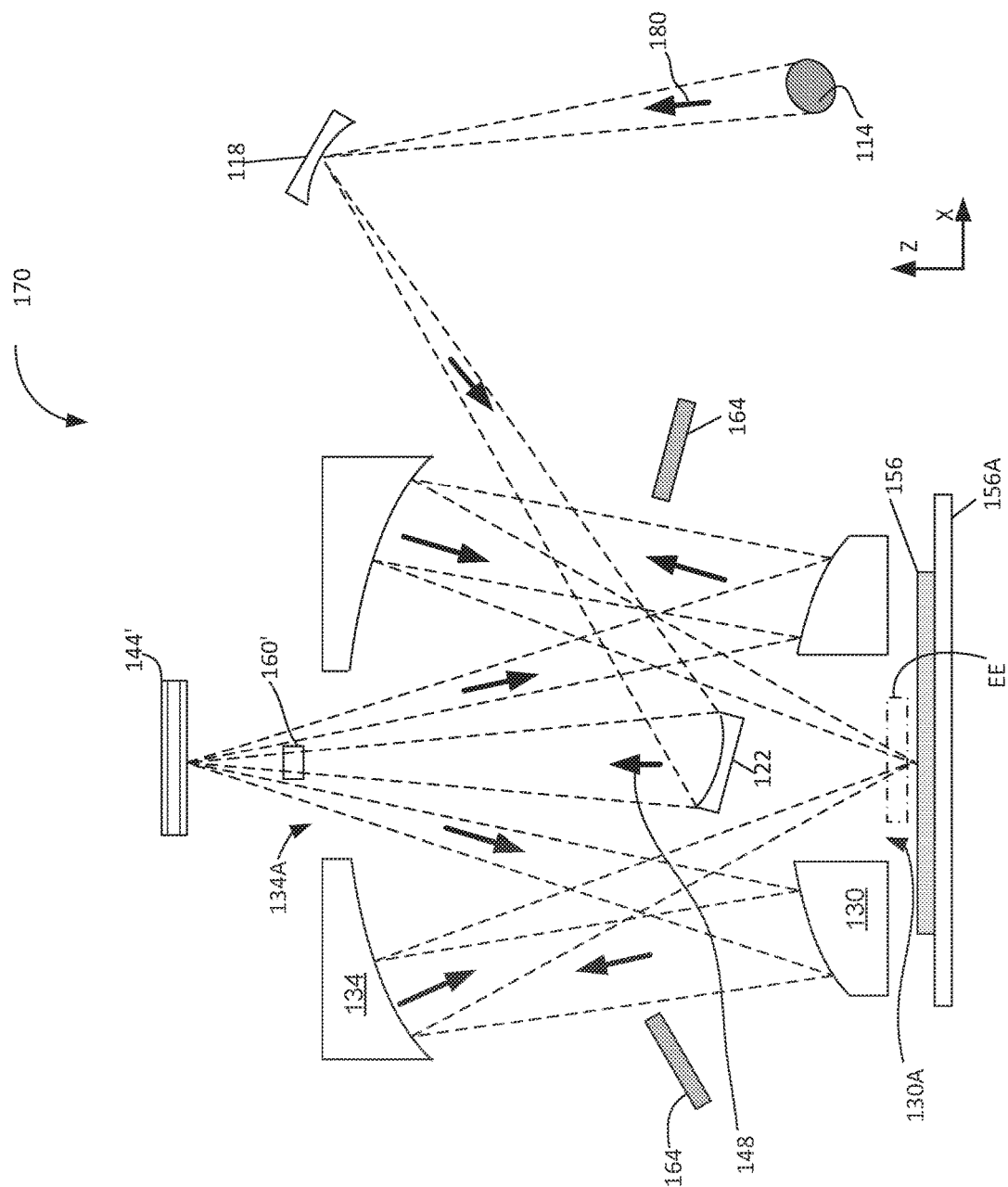

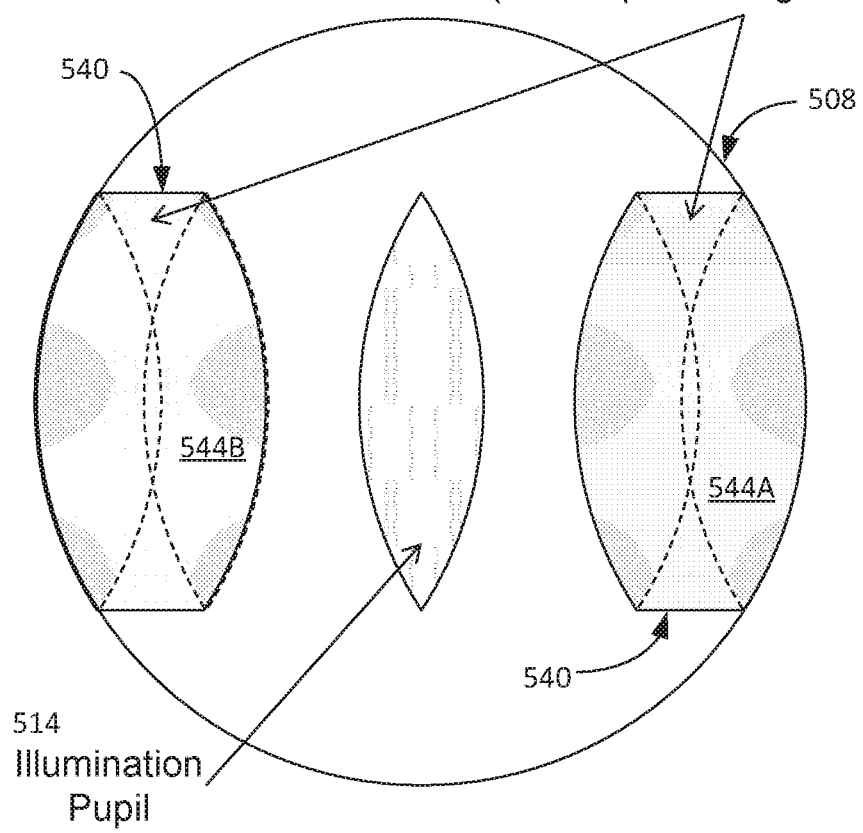

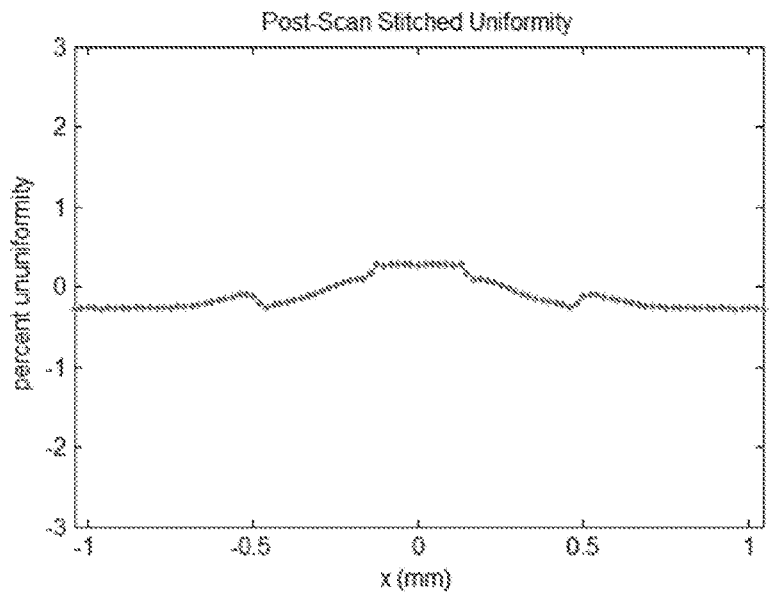
FIG. 7C
```
------------------ FE2 ------------------
number of elements = 200
element short width = 0.0136 rad
element long width = 0.015704 rad
element solid angle = 0.00016018 sr
total width = 0.1224 rad
total height = 0.3926 rad
total solid angle = 0.032036 sr
```
FIG. 8
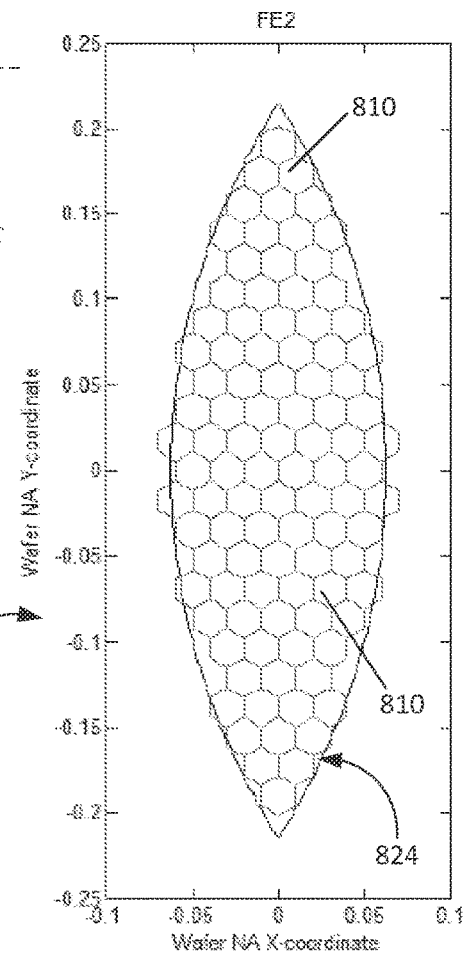

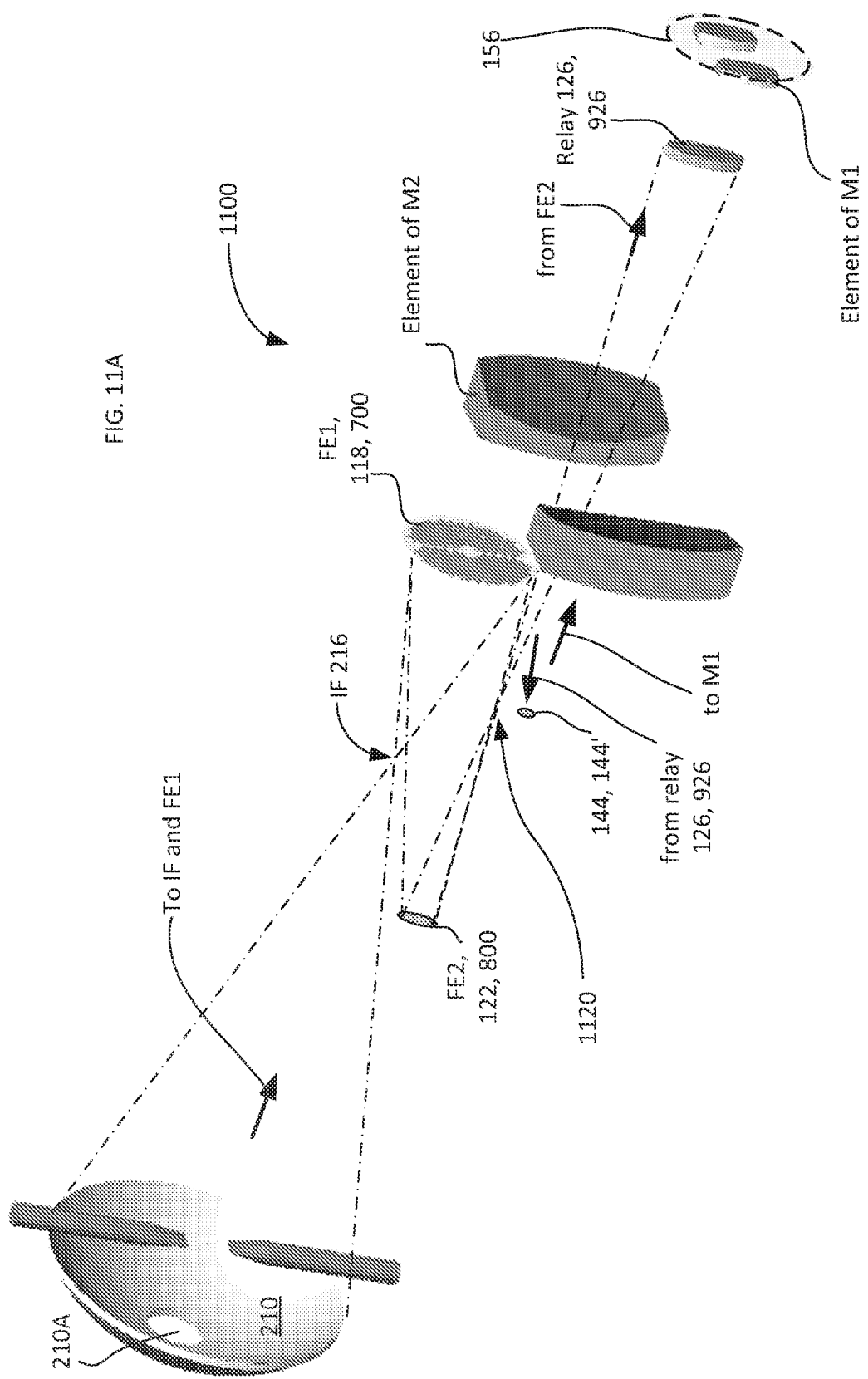

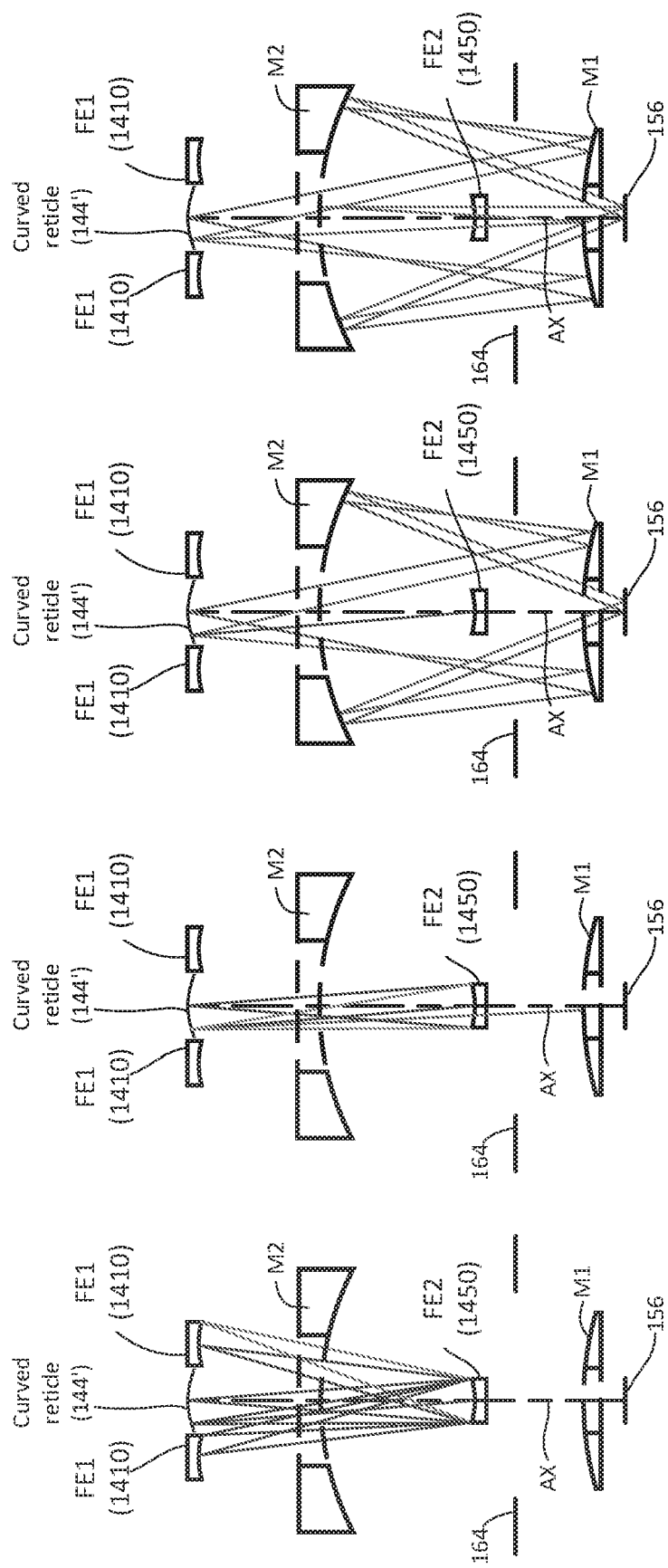

ILLUMINATION SYSTEM WITH CURVED 1D-PATTERNED MASK FOR USE IN EUV-EXPOSURE TOOL

CROSS-REFERENCE TO RELATED APPLICATIONS

This application is a continuation of International Patent Application No. PCT/US2018/031796, filed on May 9, 2018, which claims the benefit of U.S. Provisional Patent Application No. 62/504,908, filed on May 11, 2017. International Patent Application No. PCT/US2018/031796 is also a continuation-in-part of U.S. patent application Ser. No. 15/599,148, filed on May 18, 2017; Ser. No. 15/599,197, filed on May 18, 2017; International Patent Application Nos. PCT/US2018/027785, filed on Apr. 16, 2018; and PCT/US2018/029160, filed on Apr. 24, 2018. The disclosure of each of the above-mentioned applications is incorporated by reference herein.

TECHNICAL FIELD

The present invention relates to the optical design of a spatially-dense line printer configured to operate in an extreme ultraviolet (EUV) and/or an ultraviolet portion of the optical spectrum and, more particularly, to an illumination subsystem of the lithographic exposure tool configured as such a printer.

BACKGROUND

Currently commercially-available EUV lithographic equipment (referred to hereinafter as general-purpose EUV systems) is structured to image a reticle mask, which carries an arbitrary two-dimensional (2D) pattern(s) thereon onto, a rectangular field on a workpiece (such as a semiconductor wafer, substrate). Owing to the 2D nature of such pattern that has to be optically transferred from the reticle and imaged onto the workpiece, a general-purpose EUV system is necessarily implemented as a scanning system to provide for relative displacement between the substrate and the reticle. Currently, such implementation is carried out with the use of one moving stage for the reticle and at least one more moving stage(s) for the substrate, without which a transfer of all features of the reticle pattern onto the substrate with sufficient accuracy and resolution is rather complicated and, in practice, not realized. Structural and operational complexity of the currently-used system inevitably and substantially increases operational cost and reduces the number of exposures of the substrate per unit of time, in part because the transmission of EUV light through an optical system is limited. Moreover, since the transfer of the pattern onto the workpiece requires a process of optical imaging in 2D, a train of optical components of an existing general-purpose EUV system requires and is characterized by a high degree of complexity. For example, such train may include; —six polished mirrors in the projection portion (or projection optics) of the optical train, with mirror-surface roughness of less than 0.1 nm runs and mirror alignment tolerances of less than 1 nm or so; —structurally complicated and tunable illumination portion of the optical train; —and large reticles or masks with complex reflective coatings. In addition, the proper pattern transfer requires the use of complex combinations of alignment marks. All these inevitably lead to high costs of design and fabrication of a general-purpose EUV system.

SUMMARY

An embodiment provides a catoptric system having a reference axis. The catoptric system includes a reflective pattern-source carrying a substantially one-dimensional (1D) pattern defined in a spatially-curved surface; and a combination of only two optical components disposed sequentially with respect to one another to transfer an EUV radiation (incident on a first optical component from the only three optical components) onto the pattern-source. Each of the three optical components having a non-zero optical power. The combination is disposed in a substantially fixed spatial and optical relationship with respect to said pattern-source, and represents an illumination unit (IU) of an EUV exposure tool that includes a projection optic (PO) sub-system having a reference axis and configured to form an optical image of the pattern-source (with a reduction factor N>1 on an image plane, which plane is optically-conjugate to the pattern-source) with the use of only two beams of radiation. These only two beams of radiation originate at the pattern-source as a result of diffraction of the EUV radiation transferred onto the pattern-source. In a specific embodiment, the PO sub-system is a catoptric PO sub-system including only a primary reflector and a secondary reflector. Notably, the illumination unit IU may further be interchangeably referred to as an illumination lens, IL, or simply as an illuminator. The projection optics sub-system, or PO, of the exposure tool, that complements the IU may be interchangeably referred to herein as "PO sub-system" or "projection lens" or "PL".

A related embodiment provides a lithographic exposure tool having an optical train positioned to deliver EUV radiation through the optical train to a target workpiece. The optical train includes (i) a catoptric illumination unit (IU); (ii) a reflective pattern source configured to receive the EUV radiation from the IU and to diffract such EUV radiation at the substantially one-dimensional pattern of the pattern-source (such pattern being defined in a curved surface) to form first and second diffracted beams of the EUV radiation; and (iii) a catoptric projection optic (PO) sub-system positioned to receive the first and second diffractive beams from the pattern-source and form an optical image of the pattern-source (with a reduction factor N>1 in an image plane that is optically-conjugate with said pattern-source) with the use of only said first and second diffraction beams. In a specific case, the substantially 1D pattern forms a one-dimensional (1D) diffraction grating that is configured as one of (i) a phase diffraction grating; (ii) an amplitude diffraction grating; and (iii) an attenuated phase shift diffraction grating.

The lithographic exposure tool is generally configured to form the image to include a spatial frequency that is twice as high as a spatial frequency characterizing the substantially 1D pattern.

In operation of such lithographic exposure tool, the first and second diffractive beams represent respectively-corresponding diffraction orders, formed from the EUV radiation at the spatially-curved substantially 1D pattern of the pattern source, and have equal absolute values but different signs. Alternatively or in addition, the optical train may be configured to relay said first and second diffractive beams from the pattern-source to a first element of the PO sub-system such that the first and second diffractive beams are spatially separated from one another by a last element of the IU without having any of the first and second diffractive beams truncated by the last element of the IU. Here, the IU includes first and second fly's eye (FE) reflectors, and each of these first and second FE reflectors contains a respectively-corresponding array of individual constituent reflecting elements, the first FE reflector positioned to image distribution of said EUV radiation from an entrance pupil of the IU to the second FE reflector. Here, the last element of the IU is represented by the second FE reflector.

In a related embodiment, the IU includes first and second fly's eye (FE) reflectors, each of which first and second FE reflectors contains a respectively-corresponding array of individual constituent reflecting elements, and the first FE reflector is positioned to image distribution of the EUV radiation from an entrance pupil of the IU to the second FE reflector. Alternatively or in addition, i) the pattern-source is disposed in a substantially fixed spatial relationship with respect to the IU and/or ii) the substantially 1D pattern has an outer boundary and first and second contrast values remain substantially equal (here, the first contrast value is a value of optical contrast of a first portion of the image, formed at the target workpiece, that represents the outer boundary, and the second contrast value is a value of optical contrast of a second portion of such image representing a portion of the 1D pattern within the outer boundary. Alternatively or in addition, an optical element of the IU may be positioned to block a third beam of EUV radiation from propagating to a surface located between such optical element and a first optical element of the PO sub-system (here, the third beam represents a zeroth-order of diffraction, of said EUV radiation, formed at the pattern-source). When the substantially 1D pattern is associated with the spatially-curved surface, such optical element is represented by a fly's eye (FE) reflector containing an array of individual constituent reflecting elements In one embodiment of the lithographic exposure tool, the PO sub-system includes primary and secondary mirrors, and at least one of the primary and secondary mirrors contains two identical reflecting elements spatially disconnected from one another. Here, a reflecting surface of any of first and second of the two identical reflecting elements may be configured to be congruent with a section of a rotationally-symmetric surface.

BRIEF DESCRIPTION OF THE DRAWINGS

The invention will be more fully understood by referring to the following Detailed Description of Specific Embodiments in conjunction with the not-to scale Drawings, of which:

FIGS. 1B and 1C schematically illustrate related embodiments of the 1D EUV exposure tool in more detail;

FIGS. 5A, 5B, 5C, 5D, 5E, 5F, and 5G illustrate the sequence of the process of pupil construction, leading to the optimization of image contrast for the desired shape of the illumination pupil;

FIG. 7C is a plot of uniformity of irradiance distribution formed by an embodiment of the first fly's eye reflector of FIGS. 7A, 7B;

FIG. 8 is a schematic diagram of the second fly's eye reflector of the IU receiving light from the first fly's eye reflector, as viewed along the optical axis;

FIG. 11A is a schematic diagram of an embodiment of the overall optical train of the 1D EUV tool structured according to the present idea;

FIGS. 17A, 17B, 17C, and 17D illustrate optical paths of propagation of EUV radiation through the IU and PO sub-systems of the 1D EUV system in a plane parallel to the plane containing beams of radiation representing diffraction orders formed at the spatially-curved reticle.

Figure 1A:
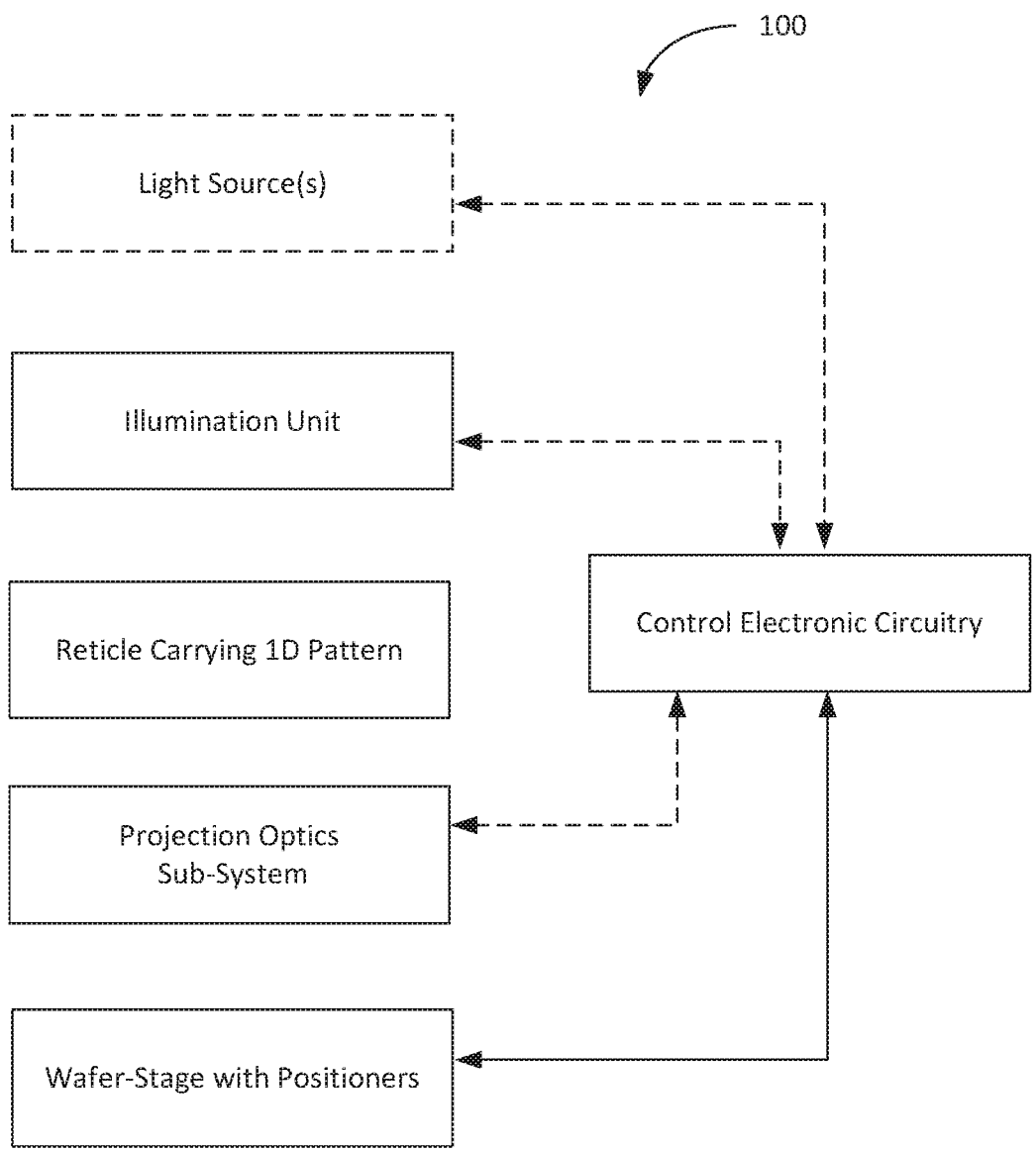
FIG. 1A provides a generalized schematic of a 1D EUV exposure tool of the embodiment.

Generally, the sizes and relative scales of elements in Drawings may be set to be different from actual ones to appropriately facilitate simplicity, clarity, and understanding of the Drawings. For the same reason, not all elements present in one Drawing may necessarily be shown in another.

DETAILED DESCRIPTION

The discussed embodiments address an optical system configured as an IU for the 1D EUV exposure tool and method are disclosed for lithographically-marking a chosen substrate (that can be generally referred to as a workpiece or wafer and that, in a specific case, can already carrying a pre-formed spatially-distorted pattern) with a new one-dimensional pattern containing spatially-densely packed parallel lines.

As was already alluded to above, general-purpose EUV systems present various problems, among which there are problems with ensuring that the general-purpose EUV systems remain commercially-competitive. These problems include: (A) Insufficient optical power generated by the EUV light sources, with which the general-purpose EUV systems are typically equipped. Currently, a typical output is about 40 W to 80 W. This problem is exacerbated by the fact that the optical power delivered to the reticle by the illumination sub-system of an EUV system from the EUV light-source is further reduced due to limited (to about 70% for each mirror) reflectance of the EUV mirrors. The illumination sub-system may further be interchangeably referred to as illumination unit, IU (or illumination lens, IL, or simply an illuminator). (B) Sensitivity of the operation of the general-purpose EUV systems to defects and/or particles on the reticle mask. Indeed, because the general-purpose EUV system is configured to image the 2D pattern from the reticle onto the wafer with high resolution, the pattern transferred to the wafer can be easily corrupted by defects or particles on the reticle. Stated differently, each defect or particle on the reticle that is larger than a few tens of nanometers can corrupt the pattern printed on the wafer. (C) Extremely tight requirements on optical aberrations of a projection sub-system, imposed by the 2D nature and high resolution of the arbitrary patterns to be printed. The projection sub-system may further be referred to interchangeably as projection optics (PO) or projection lens (PL).

The currently-used alternative to the EUV lithography process (and specifically—the process that includes multiple patterning of the substrate with Deep Ultraviolet (DUV) light, sometimes at a wavelength in the proximity of 193 nm and with the use of an immersion lens) can be less expensive but involves complicated wafer-processing between multiple exposures. Eventually, as the required resolution of features increases, a point will be reached where the multiple-patterning process cost is similar to general purpose EUV exposure cost.

For any of the above-described reasons, the use of a general-purpose EUV system and/or alternative immersion system for printing of patterns possessing simplified geometry is economically unattractive. The situation begs a question, therefore, of configuring an EUV exposure tool that is specifically and judiciously configured and optimized for imaging a pattern including densely spaced lines; specifically—in the extreme UV spectral region (for example, at a wavelength of about 13.5 nm). Not only the design and operational characteristics of such tool would satisfy the opto-mechanical requirements involved in imaging transfer of simplified reticle's 1D pattern onto the semiconductor substrate, but the reduced cost of such tool would also be beneficial for the industry. An important portion of such simplified EUV system is its illumination sub-system or unit, referred to as IU for short, which delivers light from the source of light of the exposure tool to the mask a pattern of which is intended to be imaged onto an image plane (and printed on a workpiece located at such image plane, is the main subject of this disclosure. (The projection optics sub-system, or PO, of the exposure tool, that complements the IU may be interchangeably referred to herein as "PO sub-system" or "projection lens" or "PL".)

As used herein, and unless specified otherwise, the term "one-dimensional pattern" (or, "1D pattern") refers to a geometric pattern which is defined on a surface of a photo-mask or reticle (in order to be transferred with the methods of photolithography to a light-sensitive photoresist on the substrate of choice, such as semiconductor wafer, to create an image of such 1D pattern) and generally extending across such surface along two axes that are transverse to one another. The 1D pattern may change along a first axis of the pattern while remaining substantially unchanged along the second axis (that is, the 1D pattern may be characterized by geometrical changes along the second axis the value of which does not exceed 50% of the changes observed along the first axis, preferably does not exceed 20% of changes observed along the first axis, more preferably does not exceed 10% of changes observed along the first axis, even more preferably is within 5% or less of changes observed along the first axis, and most preferably is within 1% or less of changes observed along the first axis). An example of a 1D-pattern is provided by any collection of spaced-apart essentially identical, parallel, elongated pattern elements (such as, a combination of straight parallel lines or slits in an otherwise opaque screen defined at the photomask, for example). In a specific case the 1D-pattern at hand may form a linear (1D) grating (such as a 1D diffraction grating) characterized by periodically-changing amplitude along a first chosen axis and constant amplitude along a second axis chosen to be transverse to the first axis). Furthermore, as will be appreciated by those skilled in the art, to correct for imaging distortion(s) caused by the optical system or deformations of the substrate, the 1D pattern may nevertheless have small variations along first and/or second axis. For the purposes of this disclosure, an element or component containing a substantially 1D pattern (and regardless of the specific configuration of such element or component, whether as a reticle or mask, for example) may interchangeably be referred to as a pattern-source.

In comparison, the term "two-dimensional pattern (2D pattern)" is defined to represent a collection of pattern elements the variation or change of which is necessarily defined along both mutually transverse axes. One of the simplest examples of a 2D pattern is provided by a grid or mesh (which, when it has spatial periods defined along two transverse axes, forms a 2D grating). In reference to a pattern of a photomask or reticle as disclosed herein, the 1D and 2D patterns are considered as such regardless of the curvature of a surface of a substrate (or photomask) on which they are formed. For simplicity, an EUV system configured to the present idea (in which an embodiment of the illumination unit discussed here is intended to be used) is specifically and purposefully structured to image 1D reticle patterns, and is referred to herein as a "1D EUV system". For simplicity and in contradistinction, an EUV system that is configured to provide for imaging of a 2D-patterned reticle (such as a general-purpose EUV system) may be referred to as a "2D EUV system".

The term "optically-conjugate" and related terms are understood as being defined by the principal of optical reversibility (according to which light rays will travel along the originating path if the direction of propagation of light is reversed). Accordingly, these terms, as referring to two surfaces, are defined by two surfaces the points of which are imaged one on to another with a given optical system. If an object is moved to the point occupied by its image, then the moved object's new image will appear at the point where the object originated. The points that span optically-conjugate surfaces are referred to and defined as optically-conjugate points. A first layer or pattern is defined as being carried by (or carried on) a given surface or substrate or second layer when the first layer is directly disposed onto the given surface or substrate or second layer, or when the first layer is disposed onto an intervening third layer which, in turn, is disposed onto the given surface or substrate or second layer.

Design of the IU according to the present idea and the co-optimization of it with the PO sub-system of the 1D EUV exposure tool allow for practical realization of an exposure tool or machine that is configured to optically transfer dense line patterns at high spatial resolution (which, in the case of periodic line patterns corresponds, for example, to a pitch or period of ten to twenty nanometers, preferably less than 10 nanometers, more preferably several nanometers, for example 5 nanometers or fewer) in a cost-effective way to enable 10-nanometer and 7-nanometer node semiconductor devices (defined according to International Technology Roadmap for Semiconductors, for example ITRS 2.0). The disclosed idea stems from the realization that modern, high density semiconductor chip designs are increasingly based on 1D geometrical patterns. Embodiments of the IU, specifically structured to illuminate or irradiate the 1D patterns (such as patterns representing 1D gratings) carried by an optical substrate and used in conjunction with an embodiment of the PO subsystem (also specifically configured for imaging of a set of densely packed lines) presents clear structural and operational advantages over the respective optical systems of a general-purpose 2D EUV systems in that:

The combination of the IU and PO portions (of the 1D EUV system implemented according to the present) is substantially simplified as compared to that of a 2D EUV system and can afford to and do include fewer reflective surfaces, which in practice provides for good quality exposures with less optical power required from the light source (e.g. several tens of Watts, in one example as low as about 20 W);

As a result of eliminating, from the PO of the system, of some or even many optical surfaces (as compared with the 2D EUV system), the scanning reticle stage, pellicle, and other elements, the cost of the proposed EUV grating machine can be substantially reduced.

A persisting problem of insufficient level of illumination typical for an exposure tool utilizing EUV light is solved with an embodiment of a dense-line 1D EUV lithography system by providing an illumination optics assembly with (1) first and second reflectors containing arrays of faceted fly's eye reflectors, and (2) a relay mirror disposed between such reflectors and the reticle. In such 1D EUV system, the shape of one of the fly's-eye-array reflectors preferably matches the shape of the entrance pupil of the projection optics assembly optimized for two-beam interference across the whole range of pitch values characterizing the 1D reticle pattern.

Schematic Examples of a 1D EUV Exposure Tool

Figure 1B:
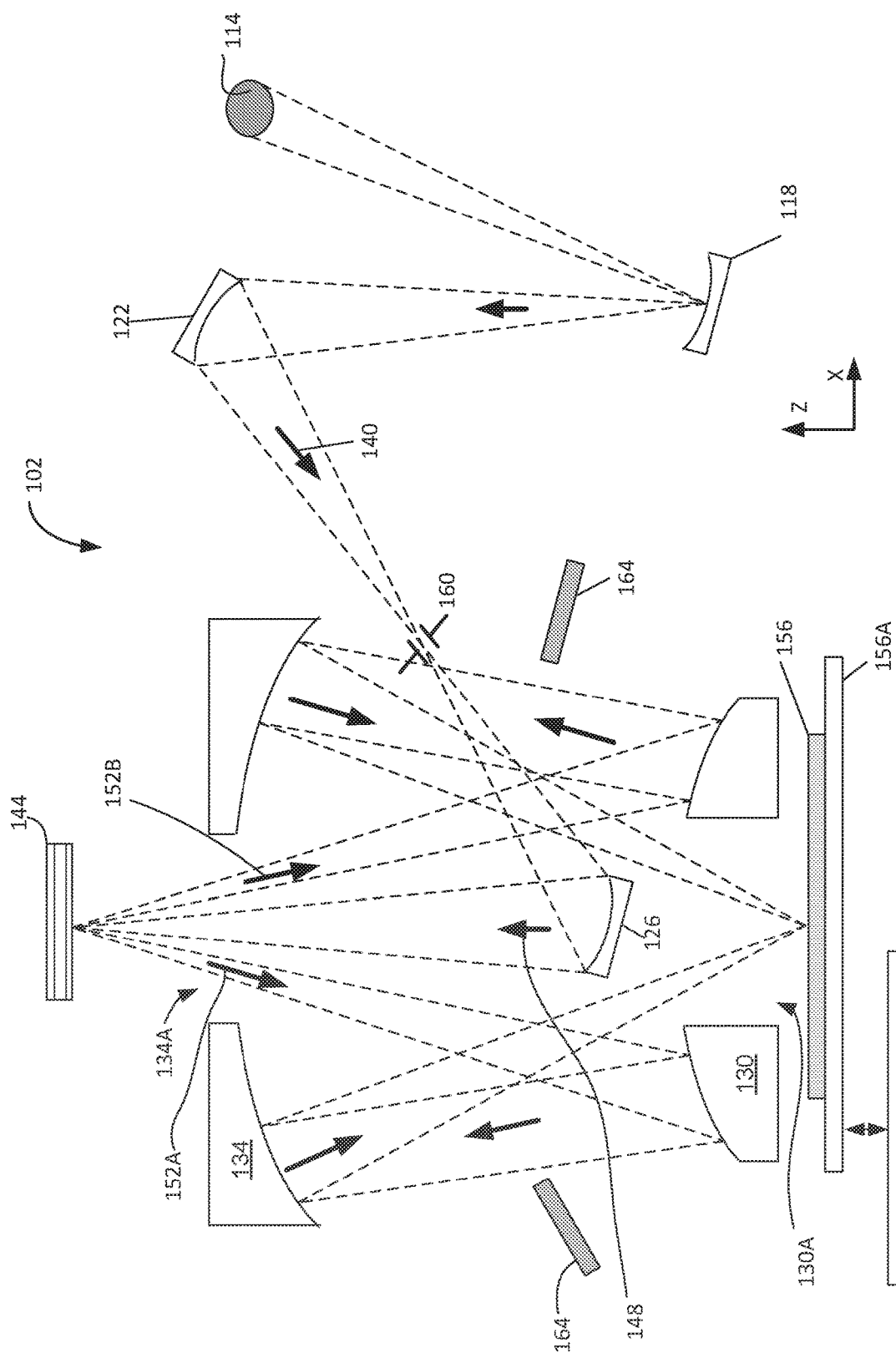

A much generalized schematic diagram of possible embodiments 102, 170 of a portion 100 of the 1D EUV system of FIG. 1A, configured according to the present idea, is shown in FIGS. 1B and 1C. The system 102, 170 may include one or more light sources (as shown—the light source 114). In the implementation 102 the system is shown to include an optical illumination sub-system or unit (IU), which contains first and second reflectors 118, 122 and a relay reflector 126; and a PO sub-system (a reflective objective) including two or more mirrors, at least one of which has an area defining an optical obscuration (a two-mirror objective of the embodiment 102 is shown to contain first and second mirrors 130, 134, each having a corresponding central obscuration 130A, 134A). The term "optical obscuration" is used herein to refer to at least a portion (of an optical element), within the bounds of which the further transfer of light incident onto an optical element to the next in line optical element is impeded, prevented, or even blocked. Examples of obscuration in a case of the reflective objective as shown are provided by (i) a through-opening in the substrate of the curved mirror (such as a curved primary mirror 130A, for example), within the bounds of which light incident onto such mirror is not reflected further toward the curved secondary mirror 130B but instead is transmitted through the through-opening, or (ii) the lack of reflective coating within the predetermined area of a mirror (substantially defining the same optical effect). The term "central obscuration" defines an obscuration centered at the reference axis of the optical system. For the purposes of this disclosure, the term "on-axis illumination" is a short hand notation for illumination where (i) the illumination propagates, on average, parallel to the optical axis and/or the direction of propagation of illumination includes the direction parallel to the optical axis (precluding dipole or annular illumination where the axial direction is absent), (ii) the position of illumination is centered on the point where the optical axis pierces the object plane.

In reference to FIG. 1B, the reflector 118 collects radiation 150 emitted by the light source(s) 114 and transfers it via reflection off the reflector 122 to the relay mirror 126 as radiation 140. The system further includes a reticle 144 disposed in optical communication with the IU and PO. The reticle 144 carries a spatially-dense 1D pattern and is positioned such as to be irradiated with radiation 148 delivered from light source(s) 114 and reflected to the reticle 144 through the obscuration 134A by the relay reflector 126. As shown, the reticle 144 is a photomask operating in reflection (in a related embodiment, the reticle can optionally be configured as a transmissive reticle). It is also intended that, depending on a particular implementation of the system 100, 102, a surface of the substrate of the reticle 144, 144' that carries the 1D pattern thereon may be spatially curved (in which case the reflective reticle has a non-zero optical power) or flat (with a substantially zero optical power). In the example of FIG. 1B, such surface of the reticle 144 is substantially planar. In the example of FIG. 1C, such surface of the reticle 144' is substantially spatially curved.

Furthermore, the 1D pattern on the reticle may be judiciously distorted in a way appropriate to compensate for undesirable distortion of the PO. When the 1D pattern carried by the reticle is configured as an appropriately-dimensioned linear diffraction grating, the reticle 144 diffracts the incident thereon radiation 148 to form diffracted beams of light that include spatially-distinct beams 152A, 152B respectively representing different diffraction orders (in one example, the +1 and −1 diffraction orders) and propagating towards the mirror 130 of the PO (the zeroth order of diffraction may be appropriately blocked from so propagating). In combination, the first and second reflectors 130, 134 of the PO redirect the diffracted beams through the obscuration 130A onto the workpiece or substrate of interest 156 to expose at least one layer of photoresist carried thereon with an image of the 1D pattern of the reticle 144.

It is appreciated that, according to the present idea, the reticle is disposed in a substantially fixed spatial and optical relationship with respect to the IU and PO sub-system in that both position and orientation of the reticle, once chosen and defined inside the 1D EUV exposure tool, are fixed (except for small adjustments that may be required to maintain focus and alignment. The term "substantially fixed relationship" refers to and defines the situation when a position of the reticle, the mechanical support of which is devoid of a structure configured to scan the reticle in a motion synchronized with a motion of the wafer-stage during operation of the exposure tool, may be, nevertheless, subject to small adjustments the magnitude(s) of which are sufficient to correct for errors in any of focus, magnification, and alignment during the operation of the exposure tool.

The system 100, 102 may also include, in some implementations, a fixed-in-size or variable aperture 160 (for example, a variable slit of a particular shape; interchangeably referred to as "pattern blind" or "blind field stop" or simply "field stop") appropriately disposed within the IU (as shown—between the mirrors 122, 126) that may be disposed to be substantially optically-conjugate to the reticle 144, 144'; a pupil stop or aperture 164 (dimensioned to match the desired shaped of the entrance pupil of the PO); a stage/mounting unit supporting the reticle (not shown); a wafer stage 156A equipped with an appropriate stage mover (not shown) to provide for scanning of the wafer 156 with respect to the reticle 144 and the beams 152A, 152B, as required by the lithographic exposure process; and other auxiliary elements (e.g., vacuum chamber, metrology system, and temperature control system) as required. An x-axis is defined to be perpendicular to the axis along which the scanning is effectuated during the operation of the system, while y-axis is defined to be parallel to such axis of scanning. In the embodiment 102, the 1D-pattern comprises lines parallel to the Y axis.

As shown in the general schematic 100 of FIG. 1A, the system further includes a control unit (control electronic circuitry), optionally equipped with a programmable processor and configured to govern the operation of at least the wafer-stage and, in some embodiments, of at least one of the light source(s), IU, and PO sub-system.

FIG. 1C schematically illustrates an embodiment 170 of the 1D EUV system 100, in which—as compared to the embodiment 102 of FIG. 1B—the relay mirror 126 has been removed. When the reticle 144' is structured to operate in reflection, the reticle 144' images the reflector 122 into the entrance pupil of the PO sub-system. Upon transmission from the light source(s) 114, a beam of radiation 180 traverses the field stop 160' that is disposed in close proximity to the reticle 144' (as shown) or, alternatively, in close proximity to the wafer 156 across a beam of radiation that was diffracted by the reticle-pattern towards the PO sub-system (as shown schematically with the dashed line EE). The proximity distance separating the field stop 160' (when the field stop is present), from the reticle is, generally, shorter than 3 mm, preferably shorter than 1 mm, more preferably shorter than 100 microns, and even more preferably shorter than 50 microns. In the example of FIG. 1C, the surface of the reticle (pattern-source) 144' may be spatially curved. The field stop 160' can be dimensioned such that diffraction beams 152A, 152B pass through the opening(s) of the field stop 160'.

The 1D EUVD exposure tool is further complemented, as shown in FIGS. 1A,1B with a control unit (control electronic circuitry), optionally equipped with a programmable processor and configured to govern the operation of at least the wafer-stage and, in some embodiments, of at least one of the light source(s), IU, and PO sub-system. (FIG. 1C does not show the otherwise present control unit, for simplicity of illustration.)

Coordination Among the Source of Light, IU Sub-System, and PO Sub-System

A person of skill would readily understand that, according to the disclosed idea, in one example the embodiment the IU as a whole is configured to operably correspond to and to be optically optimized with an embodiment of the PO containing a catoptric anastigmat, as discussed in detail in PCT/US2018/027785, the disclosure of which is incorporated herein by reference. The IU includes at least one reflector unit having a "fly's eye" structure. (In one example, both reflectors 118, 122 of FIGS. 1B, 1C are configured as fly-eye reflectors, as discussed below.)

Figure 2A:
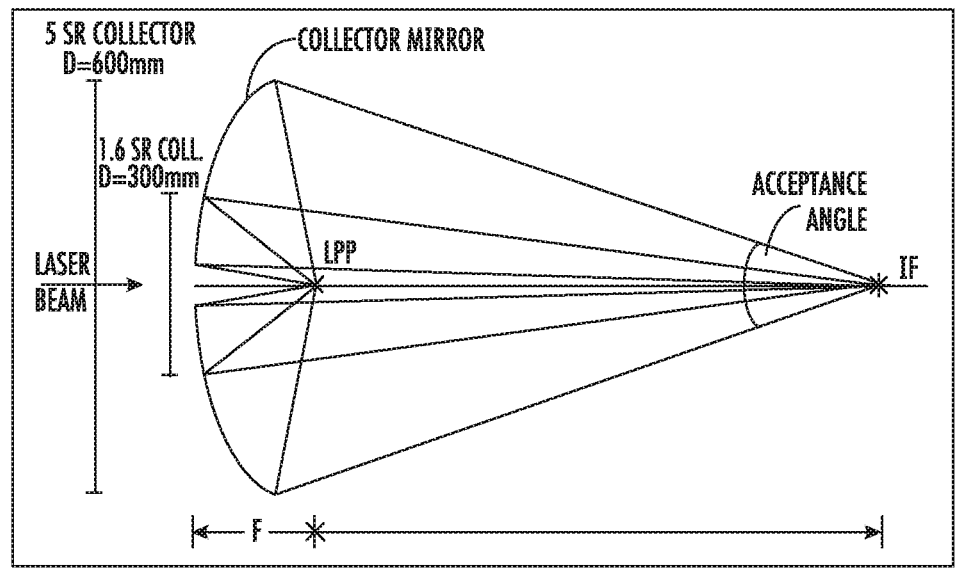
FIG. 2A illustrates a configuration of the light-collection system for a laser-driven plasma source of light with ellipsoidal mirror for refocusing the EUV radiation from the laser-driven plasma LPP to the "intermediate focus" IF (which, in turn, serves as a source of light for an embodiment of the IU, and is referred to as a secondary source of light). A 5 sr collector and a 1.6 sr sub-aperture configuration are shown schematically for comparison.
Figure 2B:
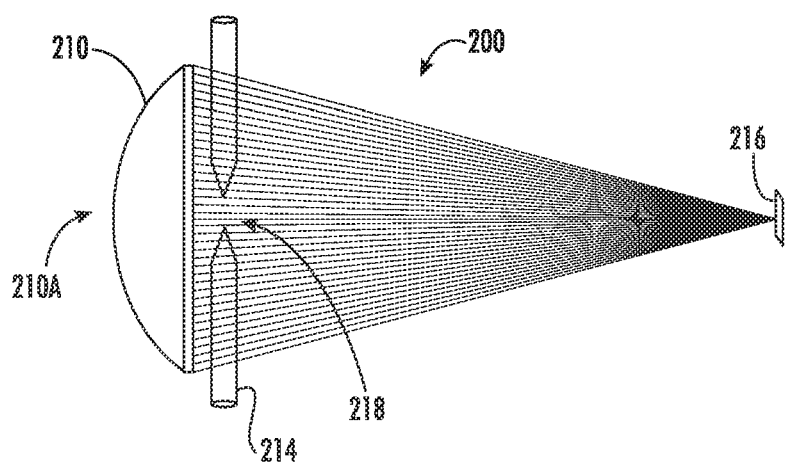
FIG. 2B is a schematic diagram of the ray-based model of laser-driven plasma source of FIG. 2A illustrating the collector 210 with the central opening 210A, tin jet 214, and the secondary source of light IF, 216.

Furthermore, the IU should be also optimized for the use with a light source (source of radiation) formed by a laser-driven plasma-based source. An example of the light-collection schematic of such source (configured for use with an embodiment of the optical system of the 1D EUV exposure tool) is shown in FIGS. 2A, 2B. FIG. 2A illustrates a configuration of a laser-driven plasma source of light with ellipsoidal mirror ("collector mirror") dimensioned to refocus the EUV radiation, received from the LPP, to the secondary source of light IF (which, in turn, serves as a source of light for an embodiment of the IU). A 5 sr collector and a 1.6 sr sub-aperture configuration are shown schematically.

FIG. 2B is a schematic diagram of the ray-based model of laser-driven plasma source of FIG. 2A illustrating the collector 210 with the central opening 210A, tin jet 214, and the secondary source of light IF 216. The model of the source of FIGS. 2A, 2B included an aperture and an obscuration mask (formed by the combination of two circles and a rectangle) that set the boundaries of a Gaussian-shaped irradiance distribution of light that scales with distance from the location of the IF 216.

Figure 2C:
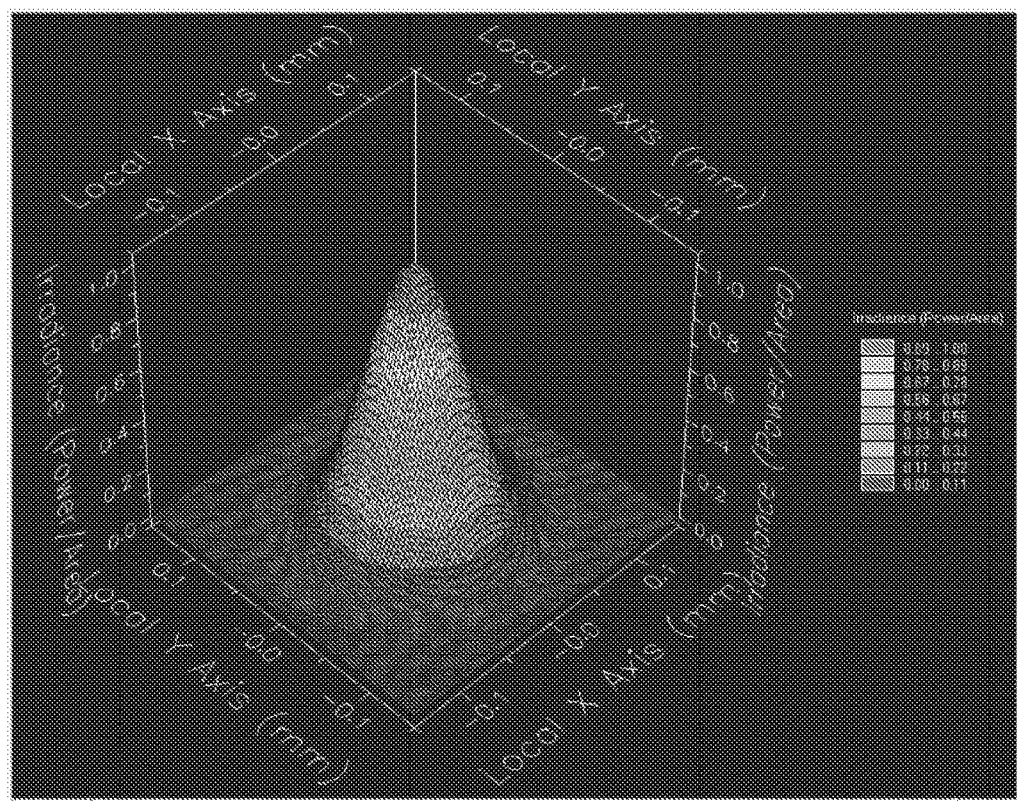
FIGS. 2C, 2D illustrate an assumed substantially Gaussian distribution of plasma of the laser-driven plasma source according to the model used for calculations.
Figure 2D:
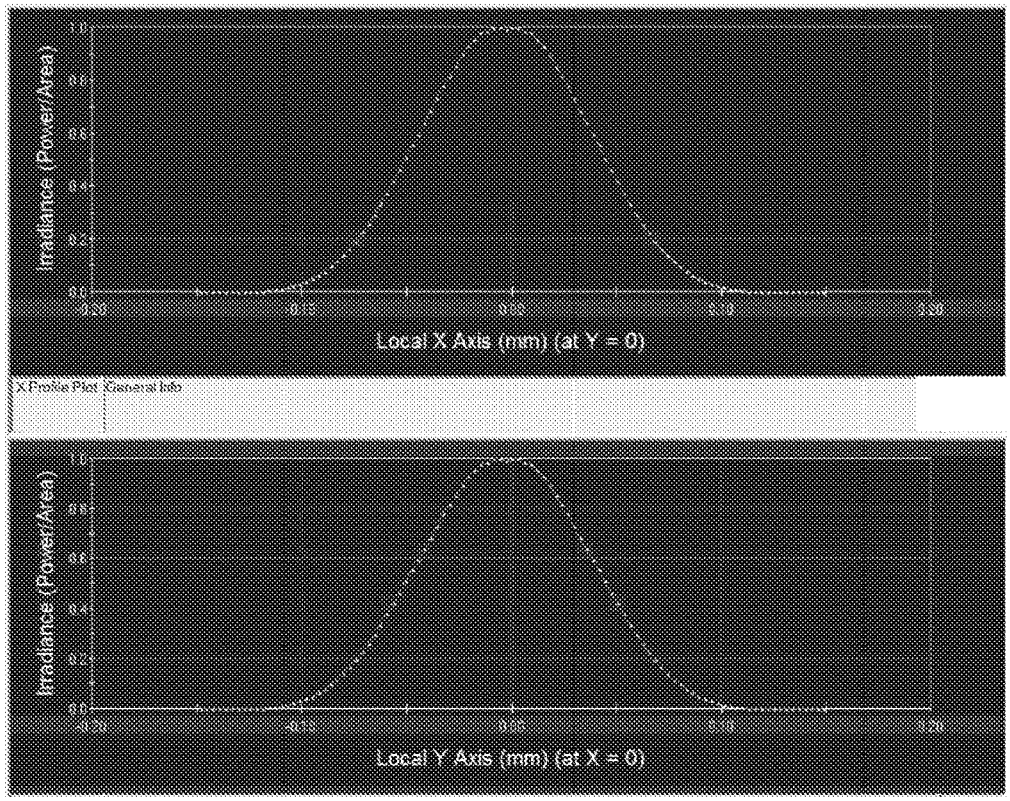
Figure 3A:
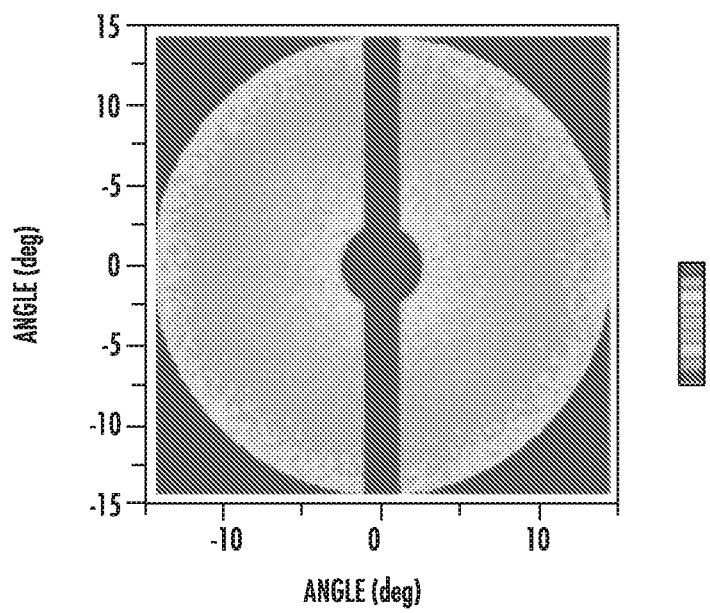
FIGS. 3A, 3B illustrate, respectively, a distribution of radiation as a function of angle, of the laser-driven plasma source model as viewed down the optical axis and an angular distribution of radiation of the same source in an identified cross-sectional plane that is transverse to the optical axis.
Figure 3B:
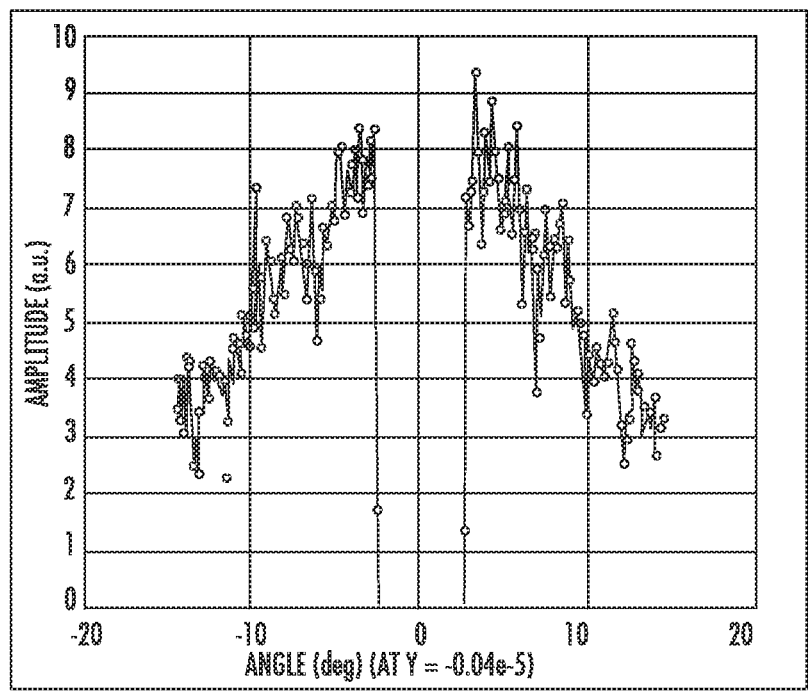
Figure 4A:
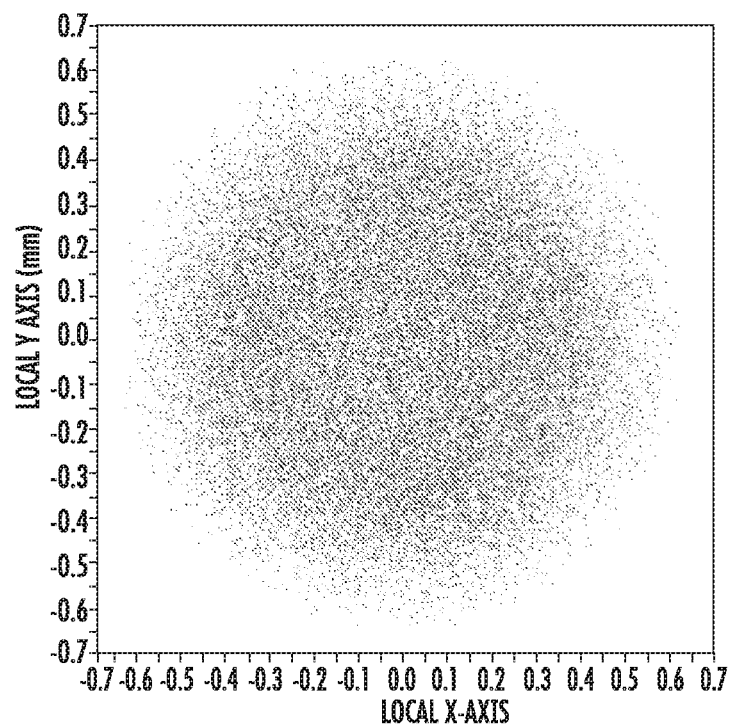
FIGS. 4A, 4B illustrate distributions of rays produced by the modelled laser-driven plasma source and directional cosines of such rays, respectively, at the plane of the secondary source of light passing through the point of convergence of the rays reflected by the collectors of the plasma source.
Figure 4B:
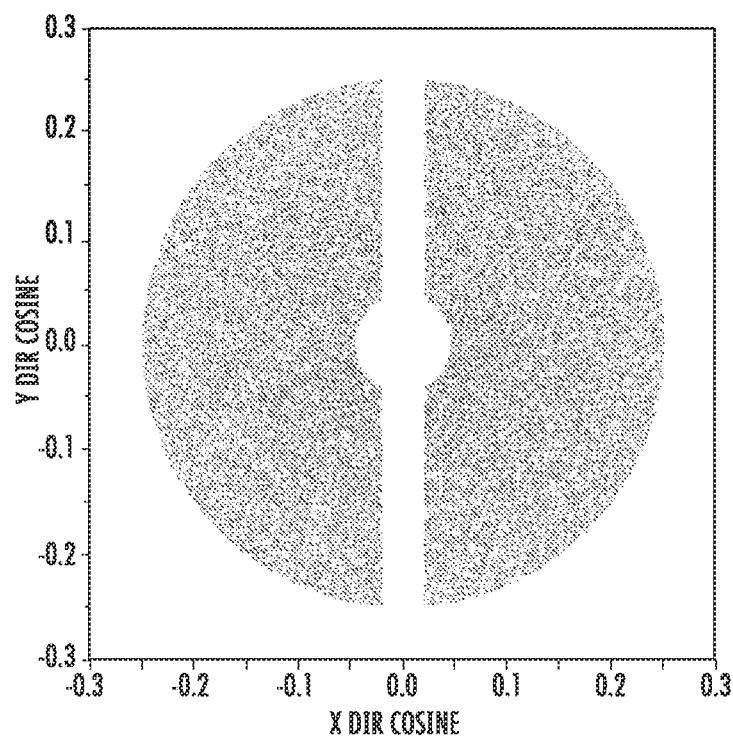

The model of the source further included the effects of: i) Three-dimensional (3D) distribution of plasma emission 218; (ii) Elliptical mirror aberrations, obscuration, and reflectance variation; (iii) Obscuration caused by a tin jet 214. The model of the source was further assumed to have: a) a 650 mm diameter ellipsoidal collector mirror 210; b) A source with numerical aperture NA defined by a 5 sr solid angle; c) Plasma 218 radiation distribution with a roughly Gaussian projection of 90 micron diameter at FWHM (or about 210 microns at $1/e^2$ level). The results of the simulated projection of such plasma distribution 218 with FRED® is presented in FIG. 2C. In the plot of FIG. 2C, irradiance of the EUV source is plotted along the vertical axis and the horizontal axis represent coordinates on the local XY plane (a plane in which the IF 216 is located and which is substantially perpendicular to the optical axis). FIG. 2D includes two plots showing the distributions of irradiance of the EUV source in two cross-sectional planes; d) The IF 216 with NA of 0.25; e) A 20% central disc-shaped obscuration 210A (formed with about 130 mm diameter as an axially-symmetric opening in the collector mirror 210); and f) a 15% linear obscuration caused by the tin jet 214 (100 mm width). The reflectance of the reflecting surface of the collector 210 was assumed to be about 50%; the effective diameter of the IF 216, allowing for instability of the lase-driven plasma source, was assumed to be about 2 mm. The modelled spatial distribution of light produced by the plasma source and the modelled spatial distribution of light at the plane of IF 216 can be assessed from a) FIGS. 3A, 3B, illustrating the intensity distributions, as well as b) the ray-spot diagram at the plane of IF 216 shown in FIG. 4A, and c) the diagram of ray directions at the same plane as shown in FIG. 4B.

Illumination Pupil

In order to determine the parameters of the illumination sub-system of the overall optical system of the 1D EUV exposure tool, the construction of ideal or target illumination conditions is in order. To the end, the construction of illumination pupil (that is, the angular distribution of light relayed onto the substrate/reticle/pattern-source 144, 144', which carries the 1D pattern/1D diffraction grating, with the use of an embodiment of the IU) has to be performed. The details of the pupil constructions were disclosed in PCT/US2018/027785.

To this end, FIGS. 5A through 5G illustrate the example of a process of pupil construction for the disclosed optical system of the 1D EUVD exposure tool. The purpose of this process is to define the opto-geometrical parameters of the PO sub-system of the embodiment that facilitates optimization (increase) of contrast of imaging of the substantially 1D pattern, located between the IU of the exposure tool and its PO sub-system, on the chosen workpiece. To this end, an image is formed as a result of a 2-beam interference (optical interference between the +1 and −1 orders of diffraction formed from light incident onto the substantially 1D pattern of the pattern-source 144, 144' such as, for example, a 1D diffraction grating, through the IU of the exposure tool) on the image plane while imaging such 1D pattern onto the image plane (where the workpiece 156 is placed). The zero order of diffraction is minimized by the appropriate design of the 1D diffraction grating and/or blocked with an opaque component (such as the element 160') in another implementation. Since the etendue of the source 114 of UV light is much smaller than the required illumination/imaging etendue, it is possible to construct an illumination pupil the area of which (the solid angle of which) is maximized for 100% contrast. This should result in wider margins of the process of manufacturing of the patterned workpiece 156.

Figure 5A:
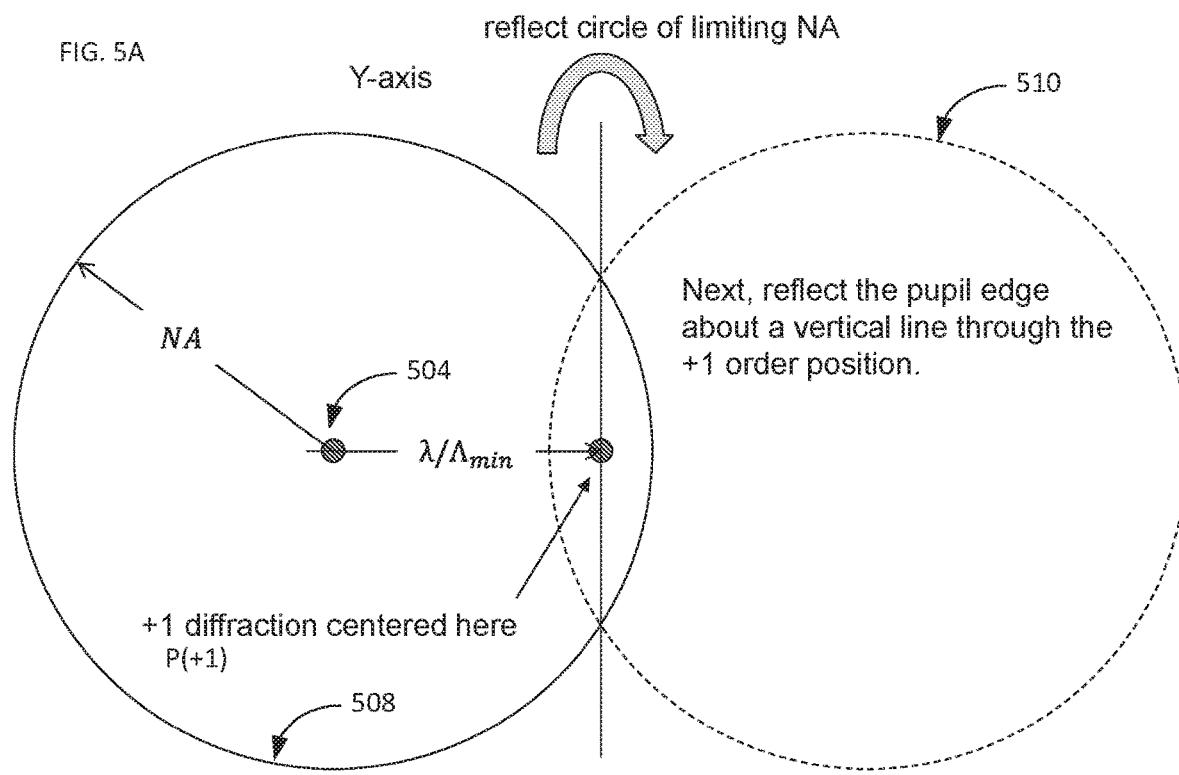
Figure 5B:
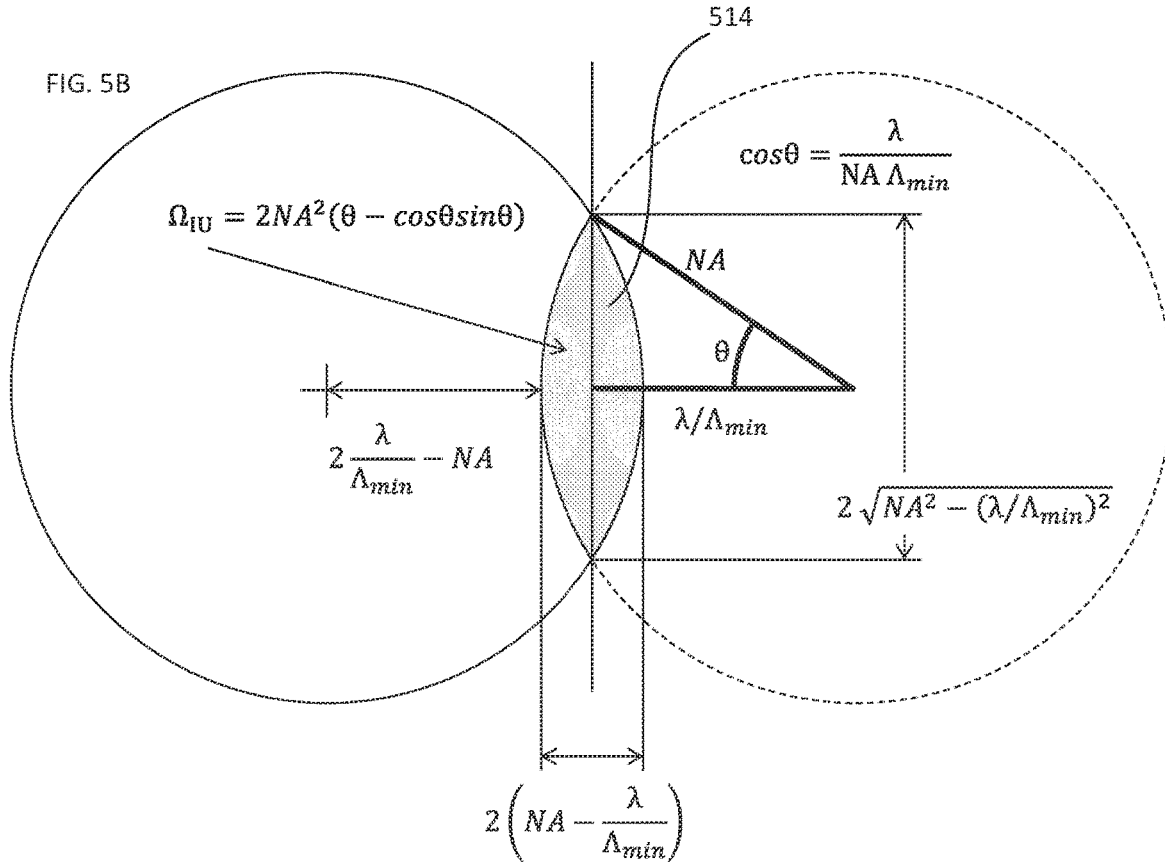

In reference to FIGS. 5A and 5B, the construction starts with an assumption of coherent on-axis illumination of the 1D (single-frequency) diffraction grating. Here, beam 504 illuminating the 1D diffraction grating of the element 144, 144' is shown on axis (as viewed along the reference axis 204). Then the +1 diffraction order beam, formed at the grating (for a grating pitch of $\Lambda_{min}$) appears at a point P(+1) that is separate by the distance $\lambda/\Lambda_{min}$ from the center of the pupil or reference axis. The pupil construction process proceeds by "reflecting" a circle 508, drawn with a radius equal to the numerical aperture NA desired in the image space (that is, in the space of a workpiece, onto which the 1D diffraction grating is imaged from the element 144, 144' by the PO sub-system) about a line passing through the point P(+1) to obtain the boundary line 510, shown in FIG. 5A with a dashed line. The ideal shape of the illumination filed—that is the spatial distribution light delivered to the element 144, 144' through the IU of the 1D EUV exposure tool—that maximizes $\Omega_{IU}$ and image contrast, is then presented by the region of overlap of the two circles 508, 510. This area 514, outlined by the overlap between the circles 508, 510 represents $\Omega_{IU}$ and corresponds to the illumination pupil (that is, the angular distribution of light incident onto the substrate/reticle 144 of FIG. 1 that carries the 1D pattern/1D diffraction grating). The geometrical parameters of the illumination pupil 514 with respect to the parameters of the curve 508 are specified in FIG. 5B.

In practice, not a single value but a range of values of the period of the substantially 1D pattern on the element 144, 144' may be of interest. Therefore, in addition to $\Lambda_{min}$ (which represent the minimal value of the 1D grating period of interest), the value $\Lambda_{max}$ is introduced, which refers to the maximal value of such period. (As a result of the imaging of the 1D grating from the element 144, 144' through the embodiment of the PO sub-system onto the workpiece 156, the 1D grating period value is reduced in half, as would be readily understood by a skilled person, when and if the zero-order diffraction beam is blocked from the propagation between the element 144, 144' and the workpiece through the PO sub-system.)

Figure 5C:
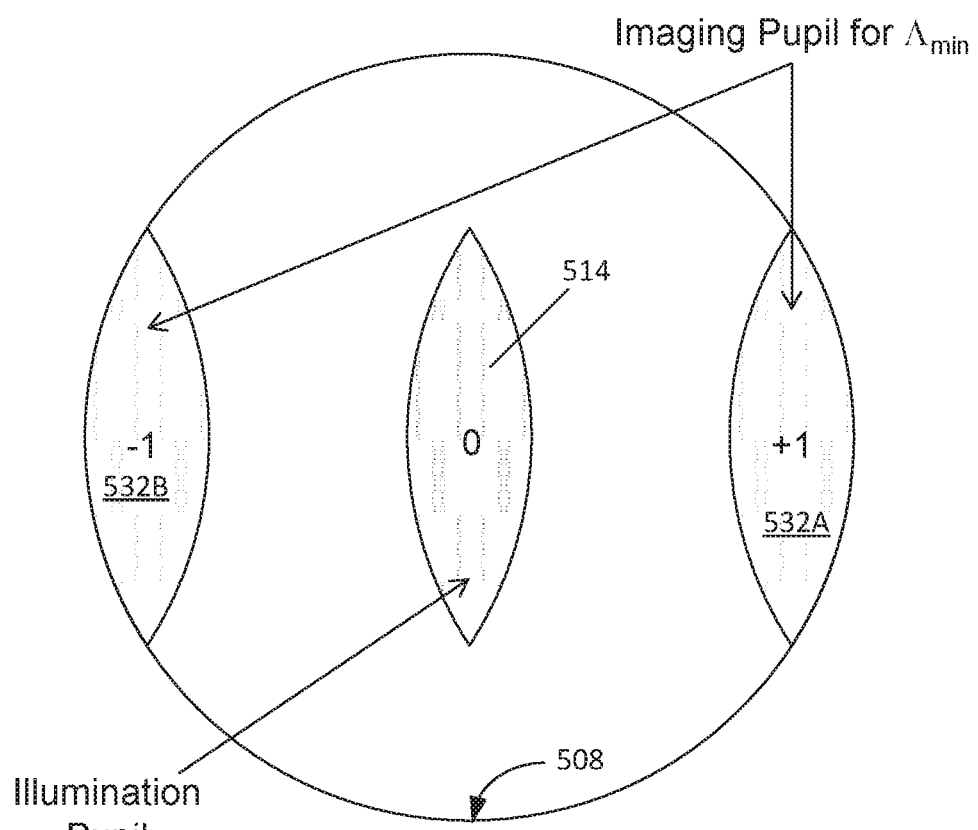
Figure 5D:
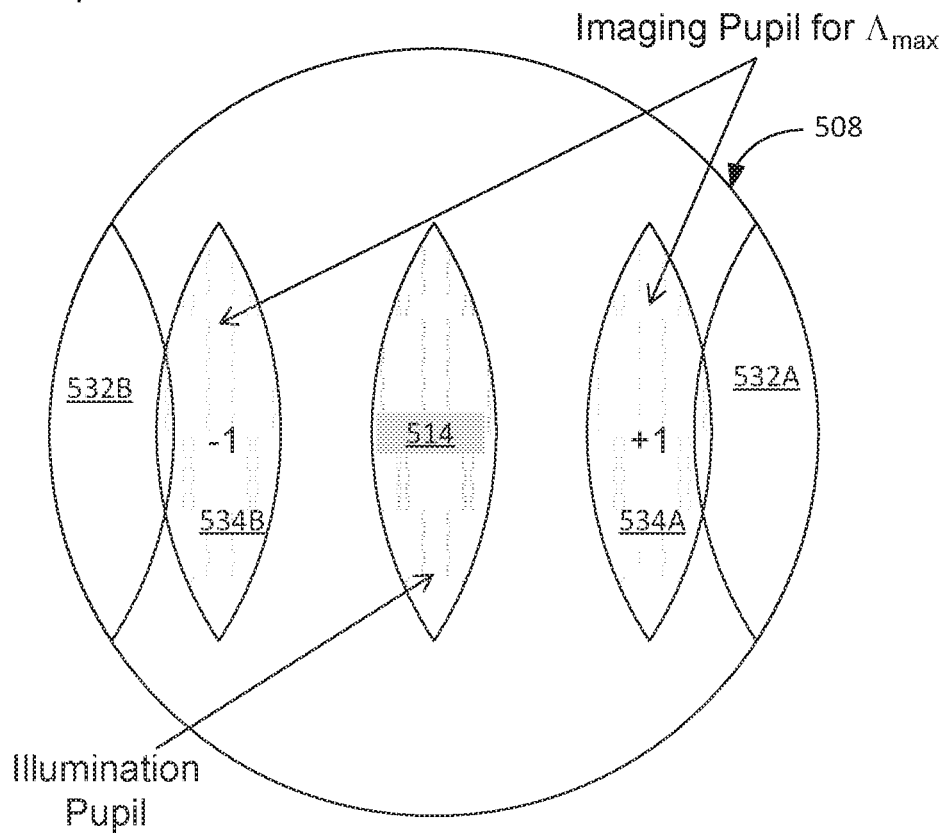
Figure 5F:
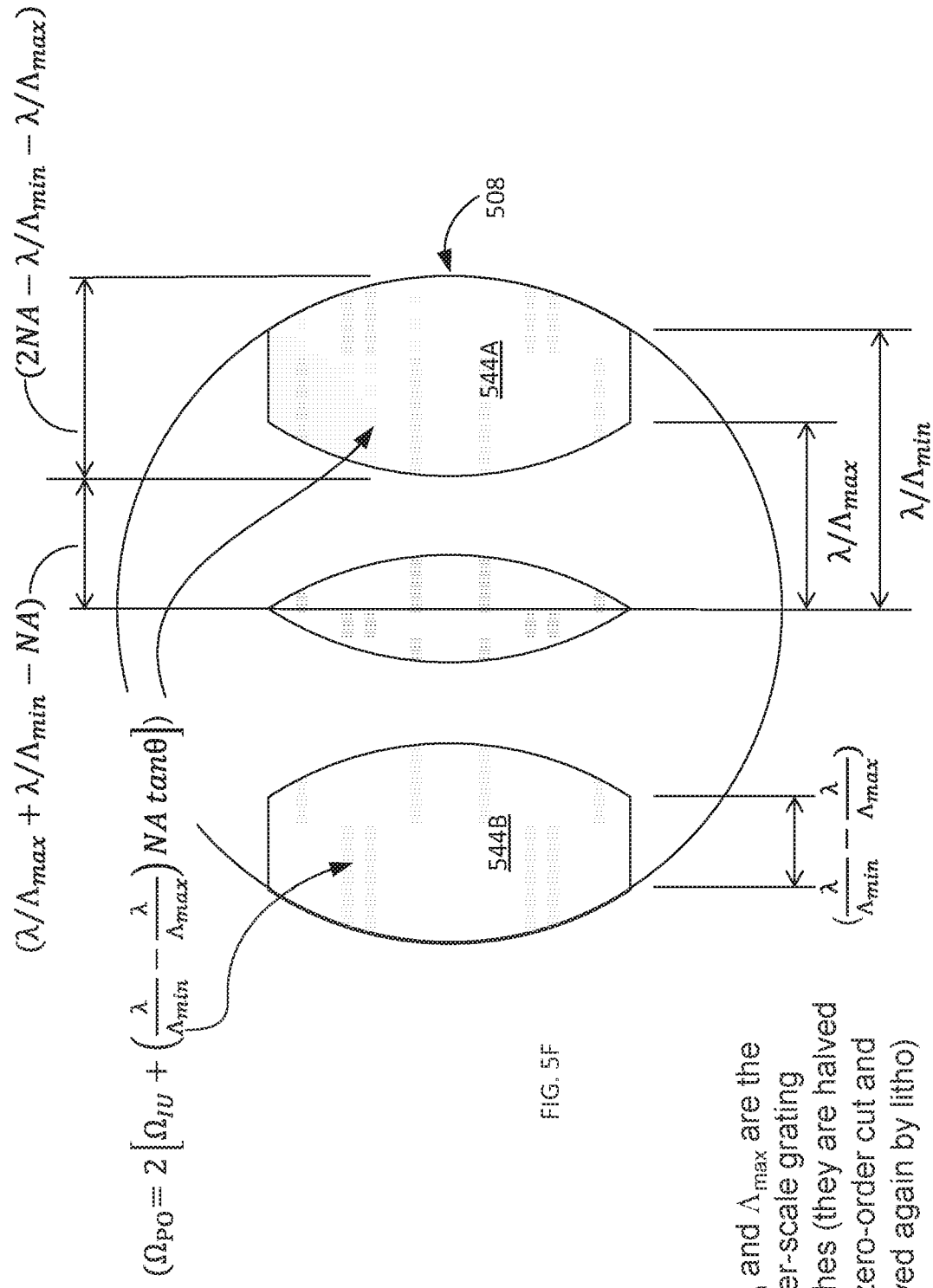
Figure 5G:
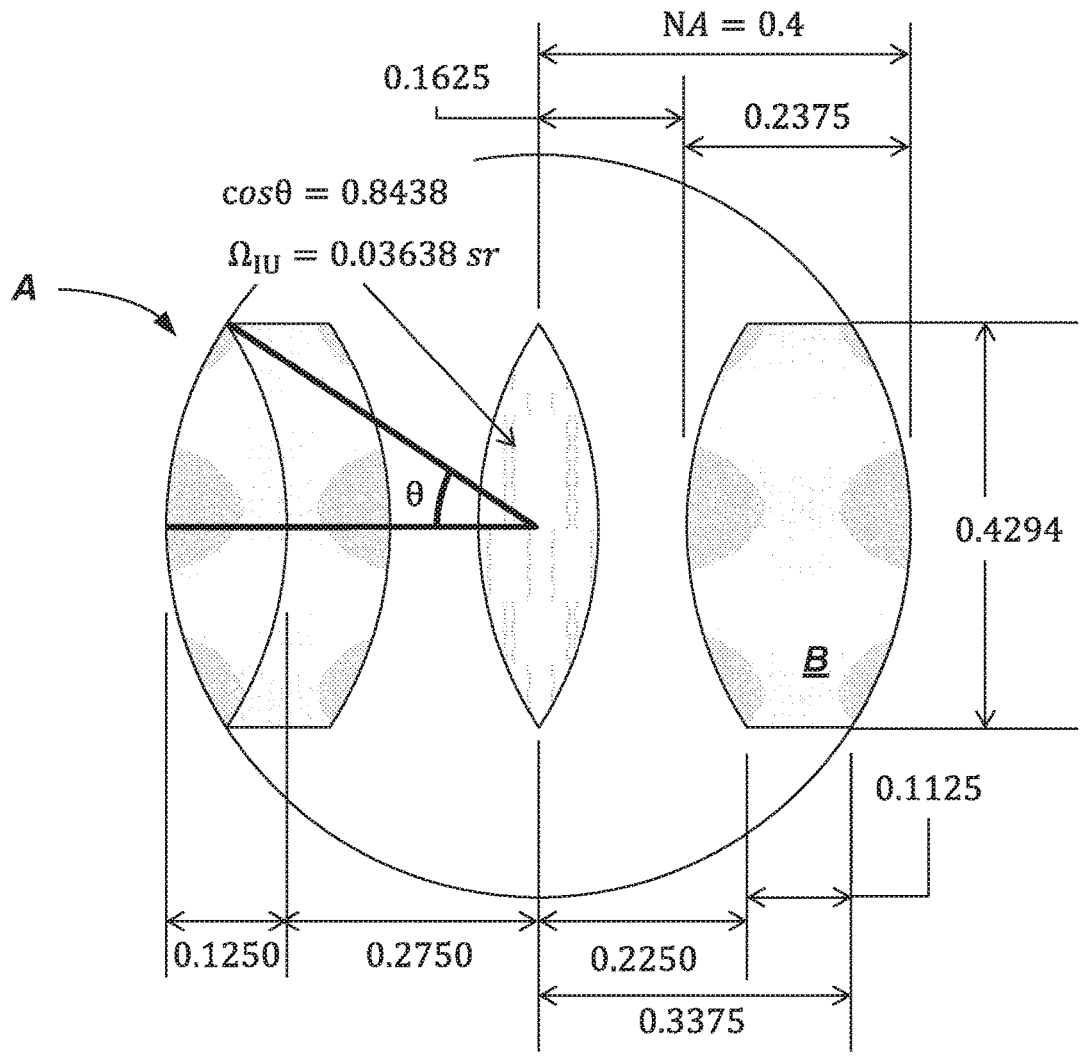

Referring now to FIGS. 5C and 5D, each illustrating the outer boundary 508 of the imaging pupil, the earlier determined leaflet-shaped illumination pupil 514 that operates as a source of light for the PO subsystem is shown to be substantially centered on reference axis 204. The imaging pupil, corresponding to imaging of the 1D grating with the period $\Lambda_{min}$ is illustrated within the boundary 508 as areas 532A, 532B for the +1 and −1 diffraction order beams, respectively. The imaging pupil corresponding to imaging of the 1D grating with the period $\Lambda_{max}$ is illustrated as areas 534A, 534B for the +1 and −1 diffraction order beams, respectively. In FIG. 5E, the boundary 540 outlines the two areas 544A, 544B of the overall, aggregate imaging pupil, configured to represent imaging of a 1D grating with any period within the inclusive range between $\Lambda_{min}$ and $\Lambda_{max}$. The same two areas 544A, 544B (shown in FIG. 5F as areas A, B) correspond to the combined solid angle $\Omega_{PO}$ subtended by the aggregate imaging pupil of the PO sub-system. FIG. 5G additionally itemizes numerical values and/or dimensions describing a specific example of the imaging pupil of the PO sub-system for the case of NA=0.4, $\lambda$=13.5 nm, $\Lambda_{max}$=60 nm and $\Lambda_{min}$=40 nm. Here, circle 508 with the radius NA=0.4 represents the numerical aperture of the distribution of light incident onto the image plane through the embodiment of the PO sub-system. (The workpiece, on which the image of the 1D diffraction grating of the pattern-source 144, 144' is formed, is disposed at such image plane). Area 514 represents the illumination pupil, subtending the solid angle of $\Omega_{IU}$. Combined area A, B represent the aggregate imaging pupil of the PO sub-system, subtending the solid angle of $\Omega_{PO}$.

First Order Layouts of the IU

Figure 6A:
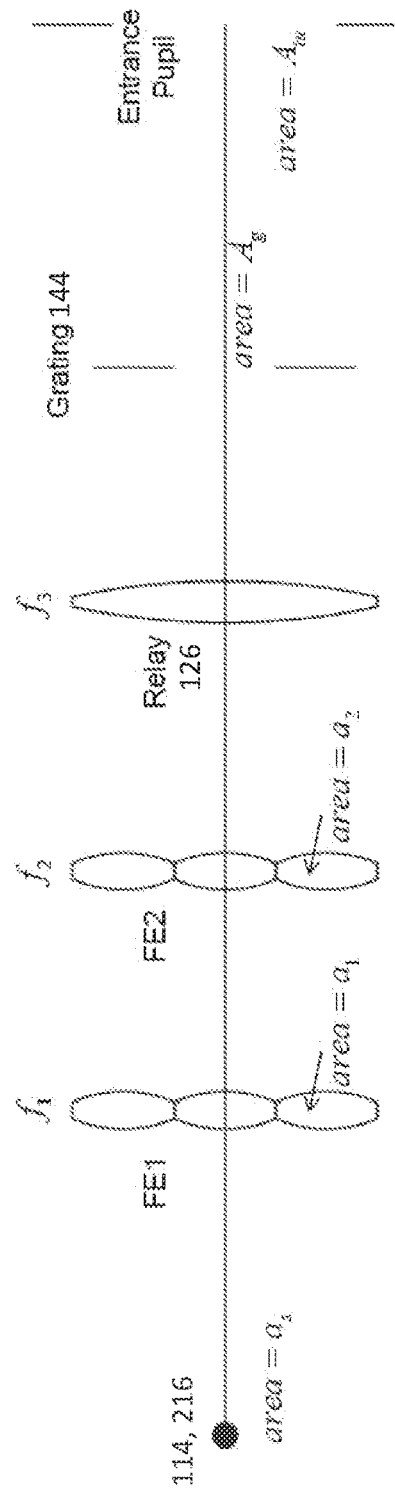
FIGS. 6A, 6B illustrate first-order layouts of the IU of the optical system of the embodiment containing a flat or planar reticle (pattern-source)

FIG. 6A schematically illustrates a first-order unfolded layout of the embodiment of the IU that includes a relay reflector 126 and that is configured to operate with a substantially flat or planar reticle 144, in which each of the FE1 and FE2 arrayed reflectors (respectively corresponding to and representing mirrors 118, 122 of FIGS. 1B, 1C) is shown to contain multiple sub-aperture reflector elements (and is shown, for simplicity of illustration, as three operationally-equivalent sub-aperture lens elements). The embodiment of the IU is configured to operate with the single secondary source of light IF, 216. Sub-apertures of the reflectors FE1, FE2, each having a specified area a, and focal length $f_i$ (or optical power $\phi_i$) are drawn as equivalent lens-elements for simplicity of illustration.

Figure 6B:
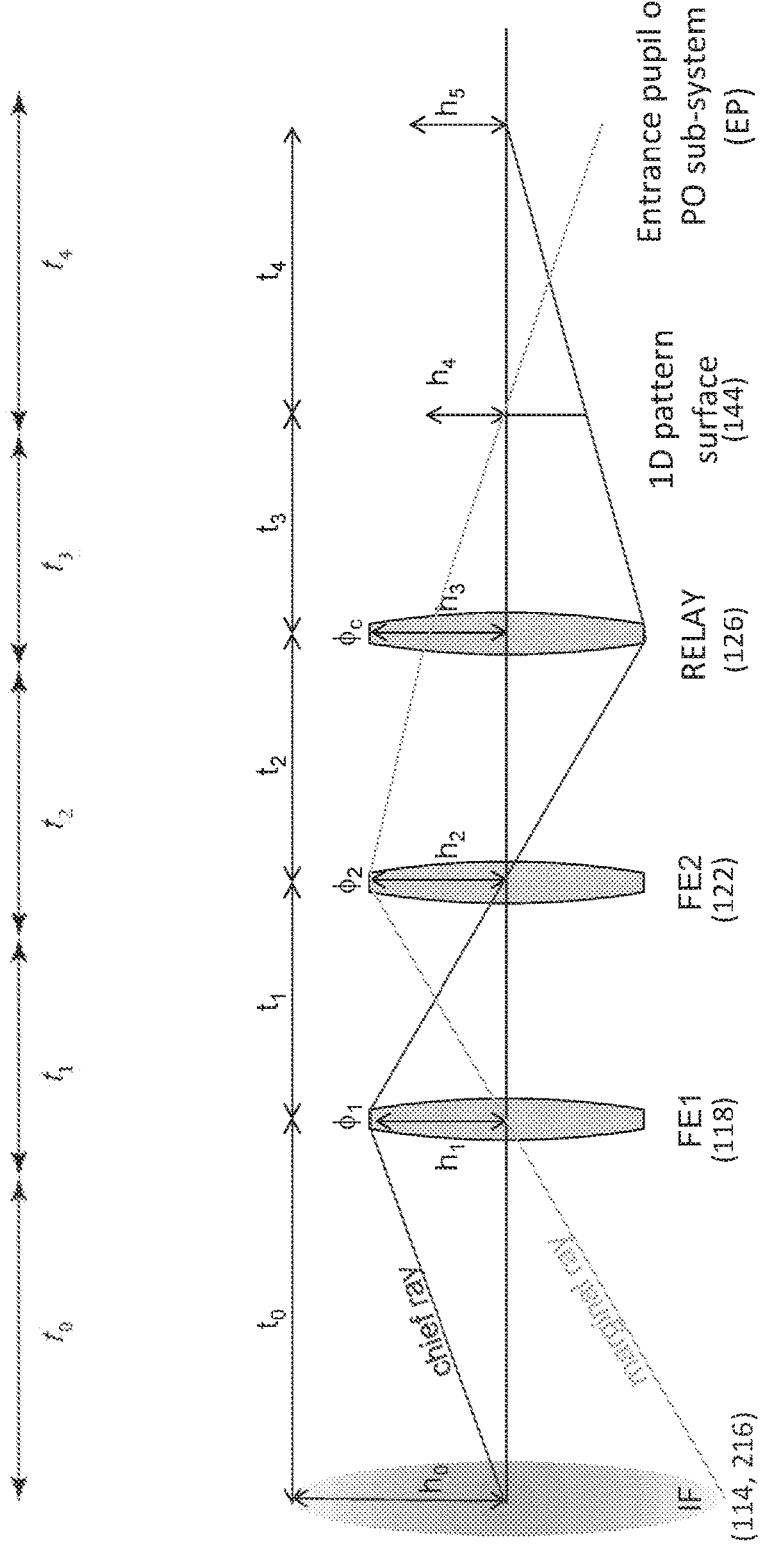

FIG. 6B shows a first-order layout of a single-channel of the overall embodiment of the IU of FIG. 6A (that is, the illumination channel defined by respectively-corresponding fly's eye elements or sub-apertures of the FE1 and FE2 reflectors). Here, the chief ray is chosen as a ray from an off-axis point of the 1D pattern passing through the center of the entrance pupil of the PO sub-system, while the marginal ray is defined as the ray from an axial point of the object (1D pattern) passing through the maximum aperture of the entrance pupil of the PO sub-system.

Figure 16A:
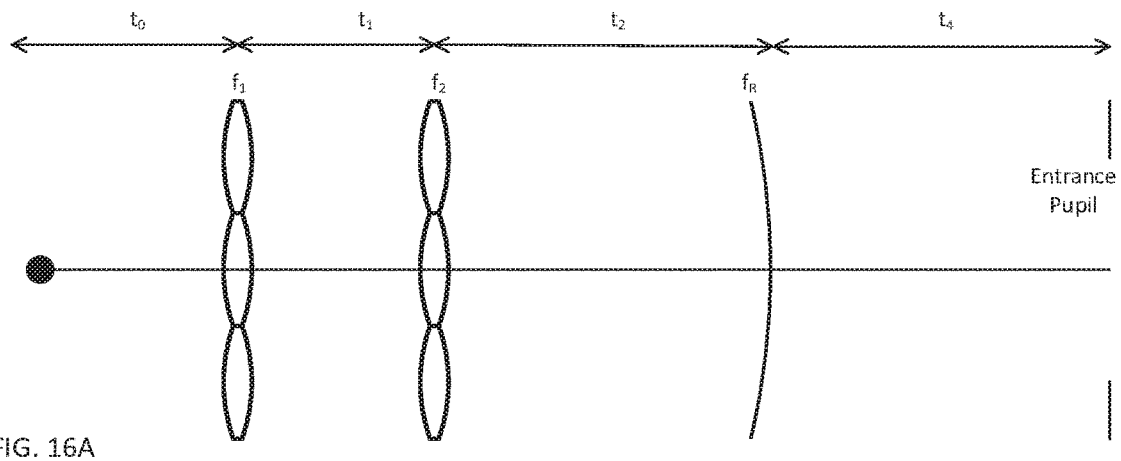
FIGS. 16A, 16B illustrate first-order layouts of the IU of the optical system of the embodiment containing a spatially-curved reticle (pattern-source)

In comparison, FIG. 16A schematically illustrates a first-order unfolded layout of the embodiment of the IU that includes only two reflectors (FE1, FE2 arrayed reflectors or reflector arrays) and that is configured to operate with a reticle 144' in which the substantially 1D pattern is disposed at a curved surface. Here, each of the FE1 and FE2 arrayed reflectors (respectively corresponding to and representing mirrors 118, 122 of FIGS. 1B, 1C) is shown to contain multiple sub-aperture reflector elements (and is shown, for simplicity of illustration, as three operationally-equivalent sub-aperture lens elements). The embodiment of the IU is configured to operate with the single secondary source of light IF, 216. Sub-apertures of the reflectors FE1, FE2, each having a specified area a, and focal length $f_i$ (or optical power $\phi_i$) are drawn as equivalent lens-elements for simplicity of illustration.

Figure 16B:
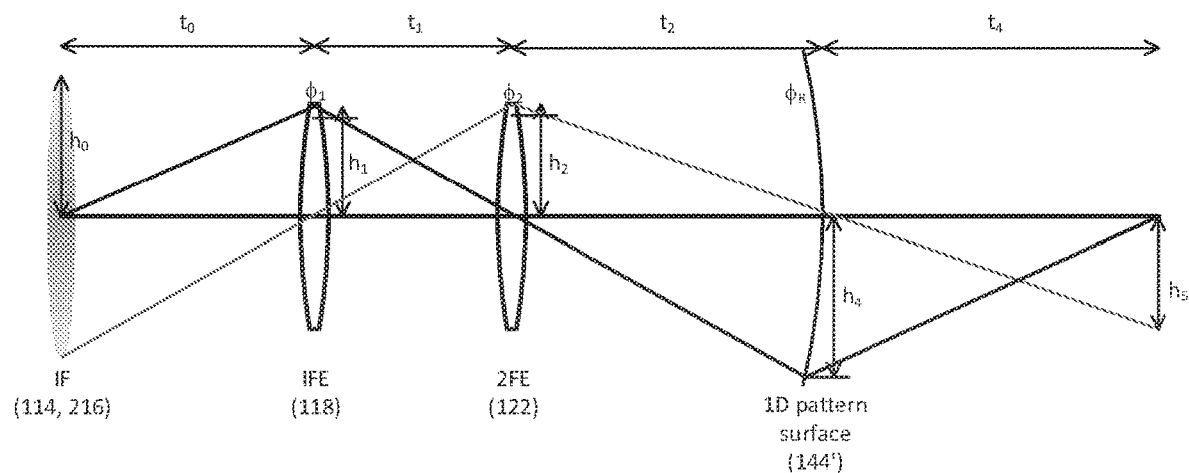

FIG. 16B shows a first-order layout of a single channel of the overall embodiment of the IU of FIG. 16A (that is, the illumination channel defined by respectively-corresponding fly's eye reflective elements or sub-apertures of the FE1, FE2 reflectors.) In this implementation, there is no need in a relay reflector because the curved reticle of pattern-source 144' images the FE2 reflector array onto the entrance pupil of the PO sub-system. Here, the chief ray is chosen as a ray from an off-axis point of the 1D pattern passing through the center of the entrance pupil of the PO sub-system, while the marginal ray is defined as the ray from an axial point of the object (1D pattern) passing through the maximum aperture of the entrance pupil of the PO sub-system.

In practice, the values $h_1$, $h_2$, $h_3$, $t_0$ through $t_3$—as well as optical powers of the FE1, FE2 and the relay reflector—are determined based on i) the sizes of the image of FE1 at the optically-conjugate surface 144, 144' and the size of the image of FE2 at the optically-conjugate surface of the entrance pupil of the PO sub-system; ii) the angles of propagation of the chief and marginal rays; iii) the size $h_0$ of the source of light 216; iv) the size $h_4$ of the 1D pattern; v) the size $h_5$ of the entrance pupil EP; and vi) the separation distance $t_4$ from the surface 144, 144' to the EP.

Examples of IU: Reflectors

One embodiment of the IU assumed a 16.5 mm wide diamond-shape exposure field on the workpiece/wafer (in one specific case—a 16.6 mm wide diamond-shape field) that enables proper stitching of exposure fields. It also assumed that the zero-order diffracted light from the 1D pattern (diffraction grating) on the reticle 144, 144' was blocked so that optical interference of beams 152A, 152B (representing the +1 and −1 orders of diffraction at the element 144, 144') doubled the spatial frequency at the workpiece/wafer and also allowed for near normal incidence illumination. (The appropriate blocking of the zero-order diffracted beam may be accomplished, when required, by the central obscuration in the PO sub-system.)

Each of fly's eye arrays (FE1, FE2) of reflectors 118, 122 is configured to capture and reflect radiant energy acquired from a radiant object (for example, source of light 216) with the use of a respectively-corresponding two-dimensional array of reflector element (alternatively referred to as "facets" or "eyes"). Such array of reflector elements or facets may be referred to as a "fly's eye reflector" (or even a "fly's eye lens", as is sometimes done in the art) normally without the aid of an additional larger viewing lens and/or reflector.

The arrangement and orientation of the array FE1 700 (optical component 118 in FIG. 1B, 1C) is a result of a tradeoff between the number of constituent elements (sub-apertures) of the array, optical throughput, and dose uniformity. When the 1D EUVD system, utilizing the embodiment of the IU configured according to the present idea, employs a single (secondary) source of light 216, the IU generally contains a single array FE1. However, in some embodiments, as discussed below, the IU may employ multiple FE1 arrays.)

Figure 7A:
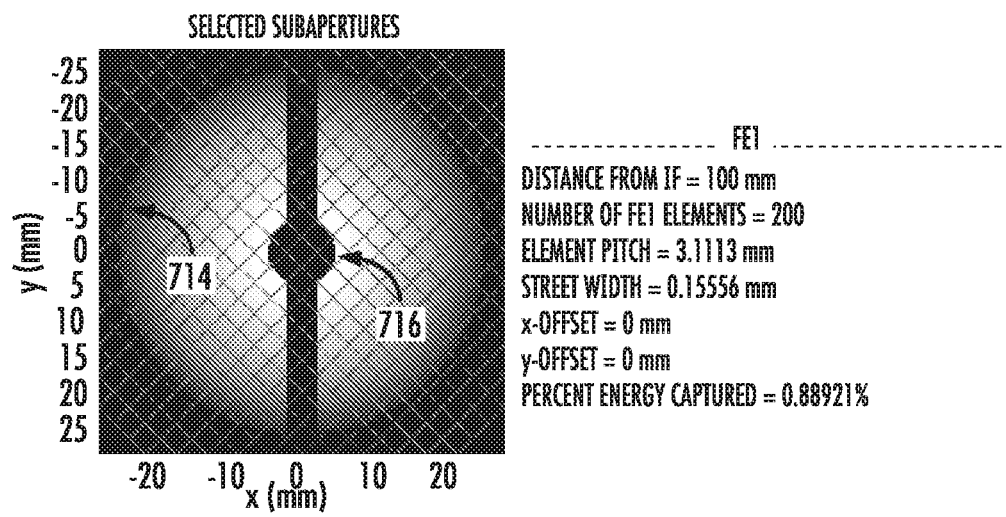
FIG. 7A is a schematic diagram showing the overlap of the "tiled" multiplicity of the sub-apertures of the first "fly's eye" reflector of the IU receiving light from the laser-driven plasma source with the view of the source itself, as perceived along the optical axis.
Figure 7B:
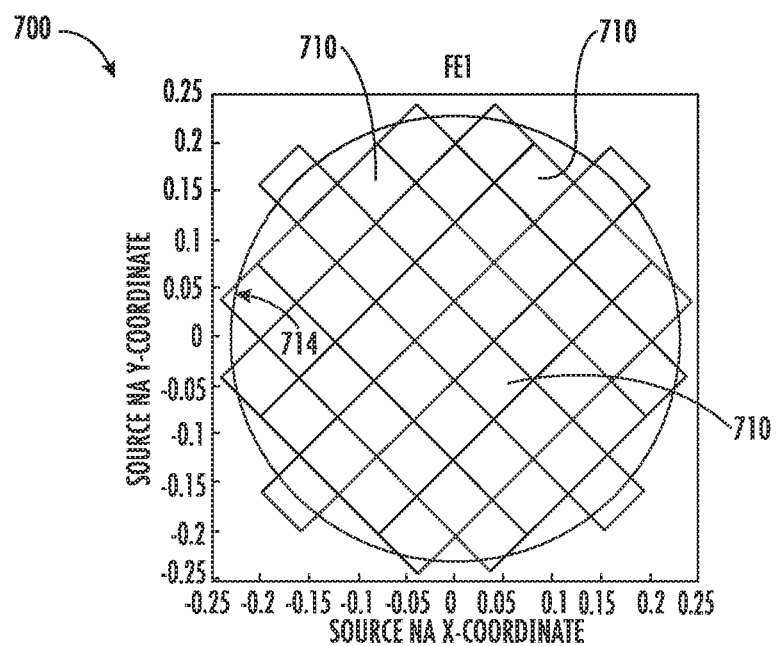
FIG. 7B illustrates the angular distribution of the individual reflector elements (sub-apertures) of the first fly's eye reflector of FIG. 7A.

The schematic of FIG. 7A illustrates the size and orientation of the sub-apertures 710 (shown as a gird) superimposed on the plot of the irradiance distribution produced by the IF 216 at a distance of about 100 mm down (along) the optical axis (compare with distribution of FIG. 3A); the final dimensions of the sub-apertures are scaled to match the actual IF distance). FIG. 7B provides a corresponding schematic illustration of the sub-apertures 710 in angular space. The sub-apertures 710 that reside outside of the outer boundary 714 of the irradiance distribution and those inside the boundary 716 of the central obscuration are not included in the practically-implemented FE1 array, as they tend to reduce the radiation dose uniformity. The arrayed reflector FE1 700 is optically-conjugate to the surface of the pattern-source or reticle 144 (see FIG. 6B), so the chosen diamond-shapes of the sub-apertures 710 are the primary indicator of the shape of the irradiance distribution at the surface 144. The choice of such shape of individual sub-apertures of the fly's eye reflector FE1 is driven by the idea to offset each pass of the exposure field across the workpiece 156 (during the operation of the 1D EUVD exposure tool) by half-the-field width so that each point at the workpiece 156 is exposed twice and receives the same dose of radiation. The practical goal here is to provide a uniform dose of radiation across the workpiece, while at the same time maximizing the light efficiency of the optical system of the 1D EUV tool. Some of itemized characteristics of an embodiment of the FE1 arrayed reflector are summarized in FIG. 7A.

The evaluation of the FE1 array also includes computation of the static irradiance distribution at the reticle by summing the distributions within each of the blue-outlined elements, and estimation of the scanned dose of radiation by integrating the reticle irradiance in the y-direction. The step of estimation of the dose uniformity upon "stitching" of the sub-apertures together and the step of determining the operably acceptable non-uniformity level (in one case—about 1%) conclude the assessment of the FE1 array reflector. The assessment of uniformity of irradiance distribution at the optically-conjugate surface 144 is illustrated in FIG. 7C as being better than about 0.5% across the overall surface of the FE1 array.

The schematic diagram 800 of the FE2 arrays reflector (optical component 122 in FIGS. 1B, 1C, for example), which is configured to relay light from the FE1 array to the reticle 144, is illustrated in FIG. 8. When a single source of light 216 is used with the 1D EUV system, the number of elements (sub-apertures) in the FE2 array 800 is the same as that in the FE1 array 700, so the process of designing the FE2 800 is substantially a matter of identifying the elements 810 so that individual images of the secondary source IF 216 (formed by combination of each of the elements 710 and the respectively-corresponding elements 810) are substantially uniformly distributed within the optimal illumination pupil 514 at the surface of the pattern-source 144. As a result, the shape of an outer boundary 824 of the embodiment 800 substantially-corresponds to the shape of the outer boundary of the illumination pupil 514.

The hexagonal shape of sub-apertures 810 is a practically reasonable choice, because such shape provides a dense uniform tiling of the surface of the FE2 array 800. Shown in FIG. 8 are the 200 sub-apertures or elements 810 (each 0.0136 radians wide in image space), which fill 88% of the optimal etendue.

It is appreciated that when the only, single source of light is used in the embodiment of the 1D EUV system, each sub-element or sub-aperture of FE1 arrayed reflector projects an image of the source into an associated/corresponding sub-element or sub-aperture of FE2 arrayed reflector. In other words, there exists a one-to-one corresponding between the elements of the two arrays, which satisfies two requirements: a) 2-fold (or at least 1-fold about y-axis) symmetry to maintain zero image shift with z-motion of the workpiece onto which the reticle 144, 144' is imaged by the PO sub-system, and b) Maximum pupil uniformity to decrease coherence of the source (at FE2).

Embodiment of the IU for Use with Multiple Sources of Radiation

Notably, however, depending at least in part on optical power considerations, the embodiment of the IU can be configured to operate not with one but with multiple sources of light. Contrasting the embodiments of FIGS. 1B and 1C, for example (in which the single source of light 114 was schematically indicated) and in further reference to FIG. 9, the specific example of the IU 900 is shown configured to operate with multiple light sources. Here (and referring to the illustration of the secondary source of light IF, 216 of FIG. 2B) two sources providing light to the IU are shown: 216-A and 216-B.

Figure 9:
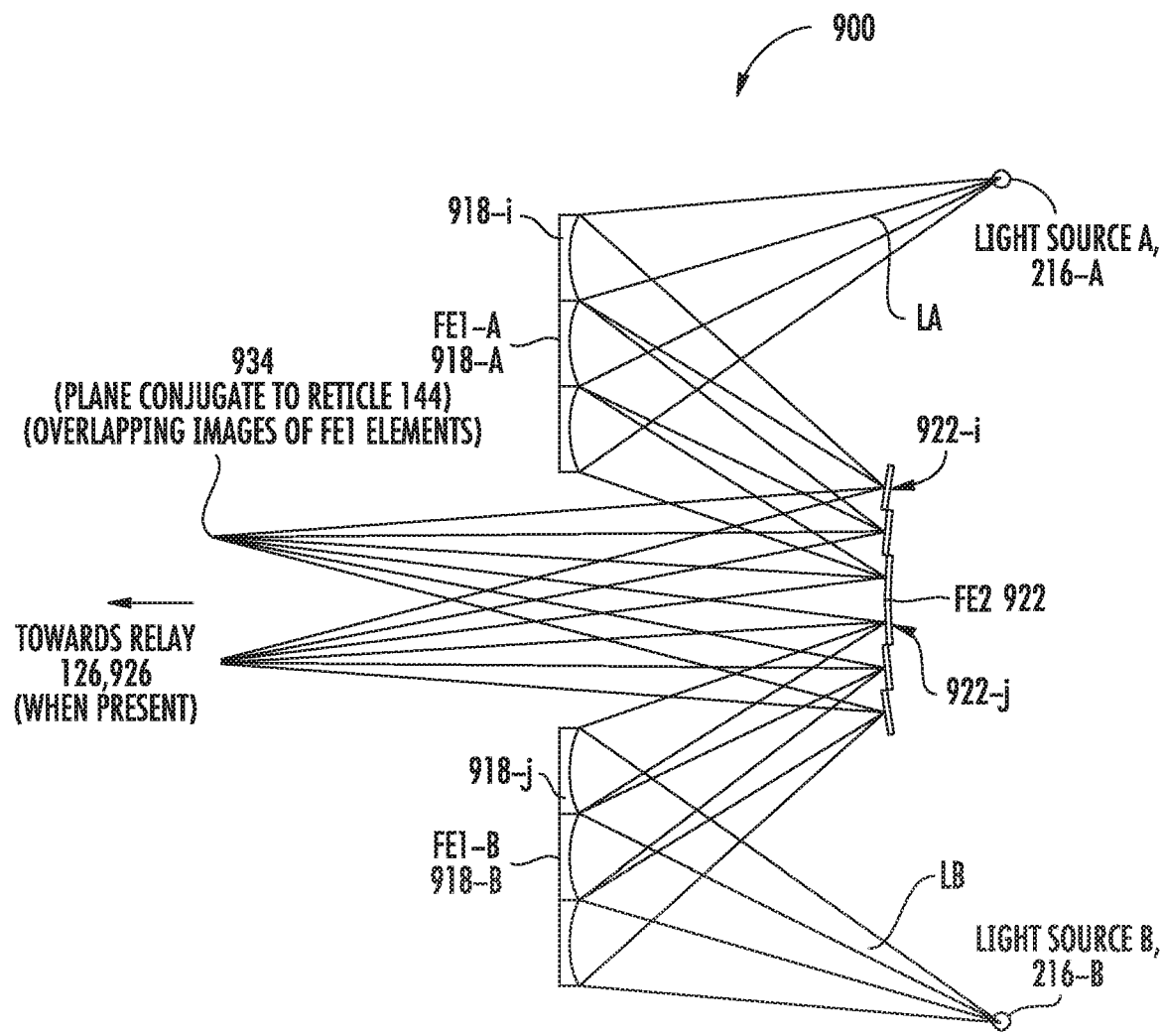
FIG. 9 is a schematic of a related embodiment of the IU of the embodiment configured for operation with multiple source of light.

The specific example of the illuminator 900 is configured to provide:

A leaf-shaped illumination pattern selected for maximum incoherence of light that accommodates no loss of contrast (for 1D pattern with a period of several tens of nm);

Two first "fly's eye" reflector arrays FE1-A and FE1-B (shown as 910-A and 910-B, each containing sub-apertures or individual constituent reflector elements 910 that have diamond-shaped perimeters);

A single second "fly's eye" reflector array FE2, 922 configured from tiles formed by individual hexagonal constituent reflector elements 922-*i* to define a leaf-shaped aperture (shown as 824 in FIG. 8) and effectively combine light inputs LA, LB received from the multiple light sources 216-A, 216-B while conserving etendue, and a curved relay mirror 126, 926 as part of the illumination unit (when configured according to the design of FIG. 1B; relay 926 is not shown in FIG. 9);

As shown, light from light source 216-A is captured by reflector FE1-A; light from light source 216-B is captured by reflector FE1-B; light reflected by FE1-A and FE1-B is captured by FE2. Each individual reflector element or sub-aperture forms an image of the corresponding radiant object as seen from the viewpoint of that individual sub-aperture's location. Stated differently, in this embodiment there exists one unique element in FE1-A or FE1-B (but not both) associated with each element of FE2. As implemented, therefore, each of the individual mirrors of FE1-A and FE1-B has a respectively-corresponding reflector element in the FE2 arrayed reflector. For example, an individual reflector 910-*i* of the array FE1-A forms an image of the light source 216-A at the individual reflector 922-*i* of the array FE2, while the individual reflector 910-*j* of the array FE1-B forms an image of the light source 216-B at the individual reflector 922-*j* of the array FE2.

It is appreciated that the proposed embodiment 900 of the IU provides an image plane 934 between the FE-2 reflector 922 and the relay mirror 126, 926 (when present). This plane is optically conjugate with both the pattern-source 144 and the plane of the workpiece/wafer 156 (see FIGS. 1B, 1C), and provides an appropriate place to locate an (optionally variable in size) aperture 160 to control the dose of radiant power passed to the reticle 144 and to define the boundaries of the exposure field formed at the wafer. In absence of the relay mirror (126, 926), the pattern-source 144, 144' with the diffraction grating on it is placed at the plane 934. For additional information on this design, a reader is referred to an example disclosed in the U.S. patent application Ser. No. 15/599,148, for example.

As shown, FIG. 9 illustrates tilted elements (sub-apertures) 922-*i* of FE2 arrayed reflector 922 that are configured to produce overlapping images of elements (sub-apertures) 918-I, 918-*j* of the FE1-A, FE1-B arrayed reflectors on the reticle/pattern-source 144 (possibly via some additional relay optic such as the relay mirror 126). However, the same effect could also be achieved by placing the elements 922-*i* of the FE2 arrayed reflector 922 on an appropriately curved convex surface. In practice it may be additionally required to "scramble" the fly's eye reflectors optical channels (so that both FE1 and FE2 arrayed reflectors have many different tilts among the constituent sub-reflector elements) to produce uniformity of the pupil.

The aperture 824 defined by the second FE reflector array 800, 922 is not necessarily limited to a leaf-shape. For example, in a related embodiment may be bow-tie shape (rectangular shape). At this time, the reflector array 800, 922 may have different dimensions in two orthogonal directions.

A person of skill in the art will readily recognize that in each of the above-discussed designs (the one containing a single source of light 216 and a single FE1 arrayed reflector, and the one containing more than one source of light and respectively corresponding more than one FE1 arrayed reflectors) there are no more than three sequential reflections of a light (EUV radiation) beam propagating from the EUV source through the IU towards the reticle/pattern-source (and only two in case the relay mirror 126 is not present, see the embodiment of FIG. 1C), which leads to a dramatic improvement in optical transmission when compared to more complicated designs of related art. Each mirror employed in the EUV spectral region typically has a reflectance of only 65% to 70%. As compared to existing designs used in general-purpose EUV machines, the number of reflections is reduced therefore approximately in half, so the amount of light transmitted through the IU of an embodiment of the invention is roughly doubled in comparison with that of the general-purpose EUV systems. Indeed, the transmission through a system can be estimates as a value of $X^N$, where X is the typical reflectance (65-70%) and N is the number of reflections. In a conventional general-purpose EUV system, an IU has at least five (or more) sequentially-disposed reflectors, while one embodiment includes as few as only 3 or fewer reflectors. Therefore, the transmission of an embodiment of the IU is increased from about 11%-17% (for a general purpose EUV system with 5 mirrors) to about 27%-34% for an embodiment of the invention.

The operational improvement effect is even more pronounced once the presence of the PO sub-system is considered. Indeed, a typical PO sub-system of a typical general-purpose EUV tool employs about six mirrors, while only two reflectors (primary and secondary mirrors) are used in an embodiment of the invention. See, for example, PCT/US2018/027785. In this case, the transmittance of 0.9%-2% for a typical general-purpose EUV system (which includes the transmission through the IU and PO, but does not include the presence of the reticle) is increased by an order of magnitude to about 12%-17% when an embodiment of the invention is used.

Embodiments of the Overall Optical Train

The Use of a Flat Pattern Source.

FIG. 11A provides a schematic diagram of the overall on-optical-axis optical train 1100 of the 1D EUV system, configured to image the substantially 1D pattern (such as a diffraction grating with a period of several tens of nm) disposed on a flat substrate of the pattern-source 144 onto the workpiece 156. (To this end, the diagram of FIG. 11A substantially corresponds to the diagram of FIG. 1B). In FIG. 11A, the rays connecting the "edges" of the source 210 with the "edges" of the relay mirror 126 are shown and can be thought of as chief rays. The function of the relay 126, 926 is to image the uniform distribution of irradiance across the arrayed reflector FE2 on the pattern-source 144. The numeral 1120 designates a location of a plane that is optically-conjugate with the flat pattern-source 144.

Referring again to FIG. 11A, the optical path of the EUV radiation (represented by the dash-dotted lines) propagating from the radiation source to the IF 216 to FE1 118 to FE 2 122 and then to the relay reflector 126, to form an EUV beam directed to irradiate the pattern-source (reticle) 144, is folded in the first plane. The two beams of EUV, formed at the substantially 1D pattern of the pattern-source 144 as a result of diffraction of the EUV beam incident onto the pattern-source from the relay reflector and representing different diffraction orders, are propagating in the second plane that is generally transverse (and, in a specific case—orthogonal) to the first plane.

It is noted that—in reference to embodiments of FIGS. 1B, 1C and in light of the schematic of FIG. 11A—the plane of symmetry of the 1D EUV systems 102, 170, 1100 is preferably parallel to the yz-plane (as shown in local coordinate system) to reduce the angles of incidence EUV radiation on each reflector, which increases the reflectance values achievable in during the operation of the system. Such configuration facilitates the minimization of the overall number of reflectors disposed in the optical path from the light source to the reflective reticle. Notably, in this configuration the axis along which the FE2 reflector array has the larger extent (shown as the Y-coordinate in FIG. 8) as well as the axis along which the lines of the substantially 1D pattern of the pattern-source are extending may be located in the first plane.

Figure 10A:
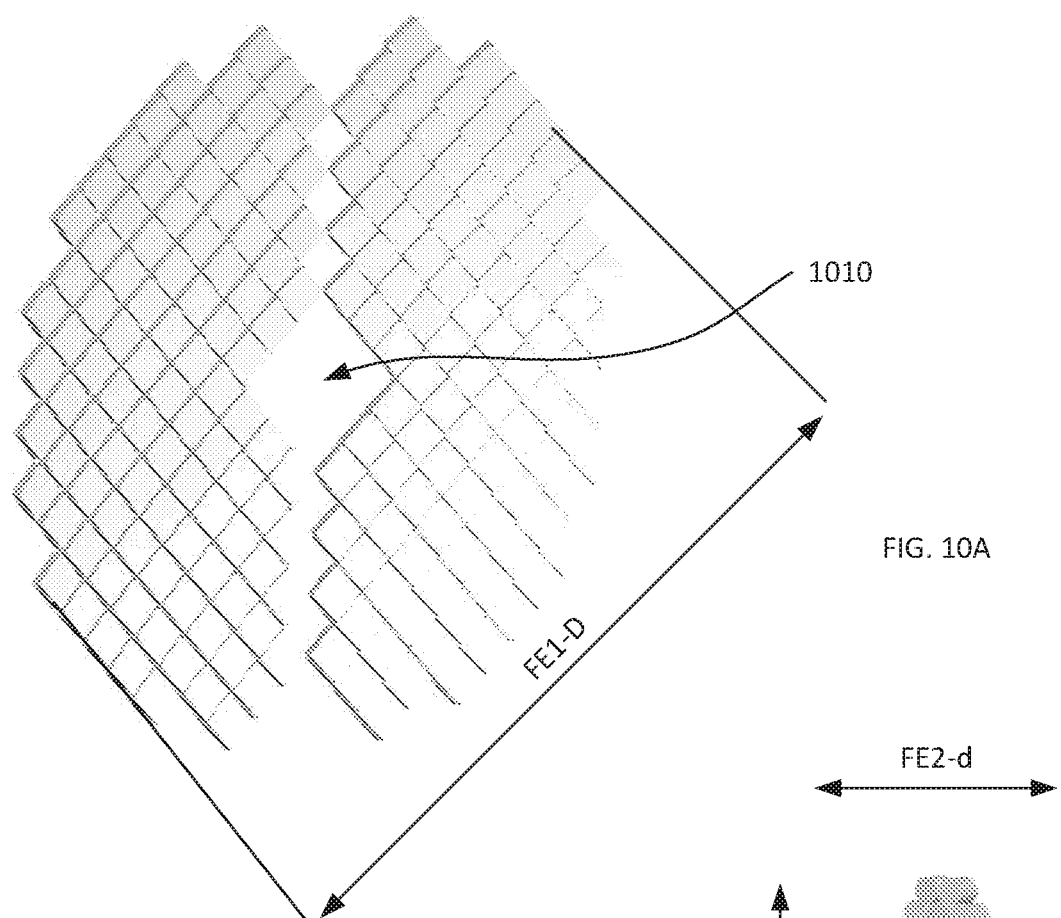
FIGS. 10A, 10B are diagrams illustrating dimensions of an embodiment of the fly's eye reflectors FE1 and FE2 of the embodiment of the IU.
Figure 10B:
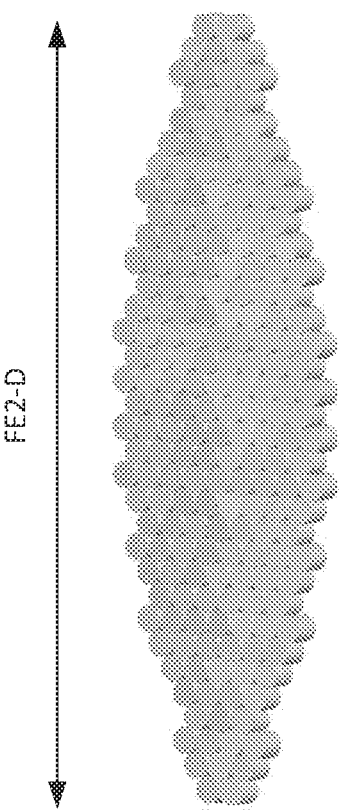

While specific values and examples chosen in present disclosure, it is to be understood that, within the scope of the claimed invention, the values of all of parameters may vary over wide ranges to suit different applications. For example, in a related embodiment the pattern-source 144 can be located among the sub-apertures (that is, among the constituent individual reflecting elements) of the array 118, 700—for example, in a space provided in the center 1010 of the array FE1, as seen in FIG. 10A.

Figure 11B:
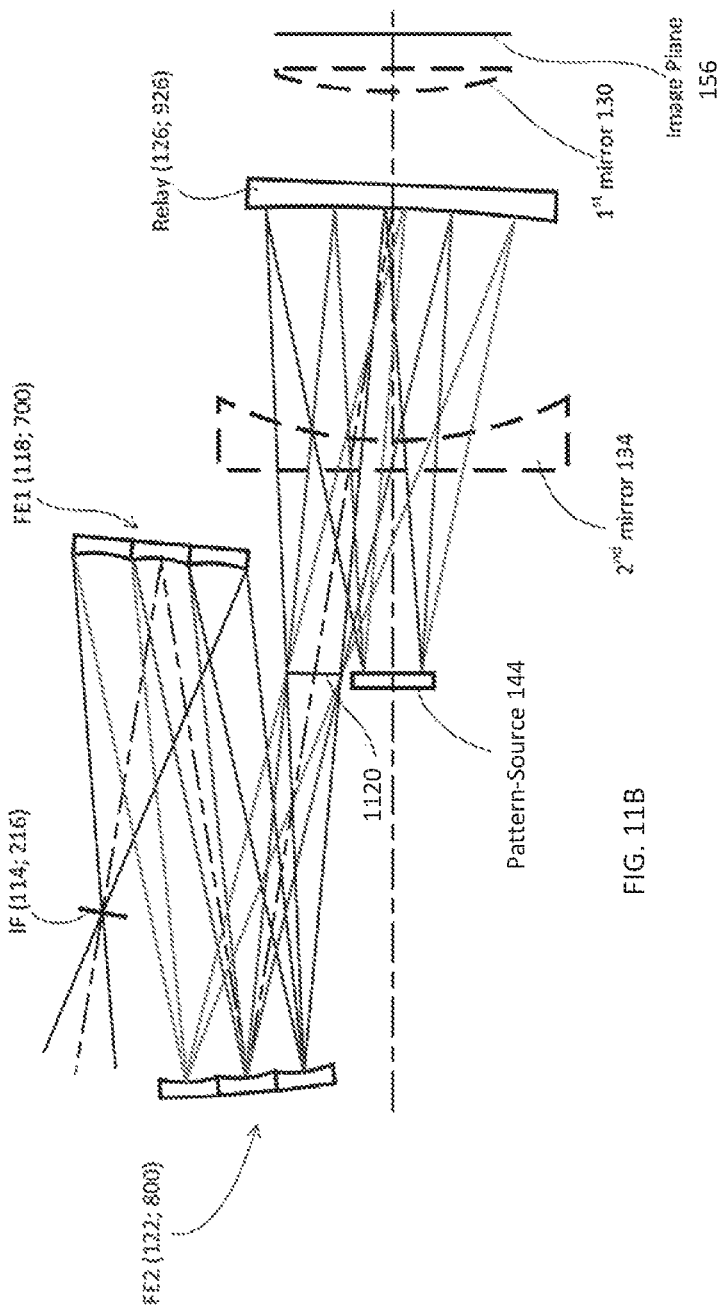
FIG. 11B provides an illustration of the optical path inside the embodiment of the IU.

FIG. 11B is a schematic diagram illustrating the optical path of EUV radiation inside the IU portion of the optical train 1100, in a plane that is perpendicular to the plane in which the diffraction beams of radiation formed at the pattern-source 144. Here, the relay reflector 126 is operating at magnification of −1; and the reflectors 134, 130 of the PO objective are shown in dashed lines. As is apparent from FIG. 11B, the divergent light beam from the intermediate focal point IF (the light source 114, the secondary light source 216) is incident on the FE1. Each reflecting element of FE1 reflects and converges this incident light beam to form a point of convergence on the reflecting surface of FE2 or in the vicinity of the reflecting surface of FE2. These points are substantially optically conjugate with the intermediate focal point IF. The light beams reflected by the reflection surfaces of the FE2 overlap each other on the surface 1120. This surface 1120 may be a surface optically conjugate with the surface of the pattern source 144. The light beam that passed through the surface 1120 is reflected by the relay 126, 926 and reaches the pattern source 144. Here, the location (a part of the surface 1120) optically conjugate with the pattern source 144 may be located on the side of the pattern source 144. Further, the light beam going from the FE2 to the relay 126, 926 may approach the optical axis (one-dot chain line in the drawing) upon its propagation. The light beam going from FE 1 to FE 2 may approach the optical axis (one-dot chain line in the drawing) as it proceeds. The relay 126, 926 may be positioned to have its axis be inclined with respect to the optical axis of the projection objective PO (indicated with the two optical elements 134, 130 shown in a dashed line). In other words, the reflecting surfaces of the relay 126, 926 may be inclined with respect to the optical axis of the PO. The direction in which the principal ray (chief ray) of light propagates from the relay 126, 926 to the pattern source 144 may be substantially parallel to the optical axis of the projection objective PO.

The Use of a Curved Pattern-Source.

The use of a curved pattern-source 144' (that is, a pattern-source the substantially 1D pattern of which is disposed in a curved surface, as opposed to the use of the substantially planar pattern source 144) leads to a substantially reduction of length of the PO sub-system of the 1D EUV lithographic tool (and a version of the PO sub-system such as that discussed in reference to FIG. 12 of 62/487,245, for example, can be then employed).

Figure 14A:
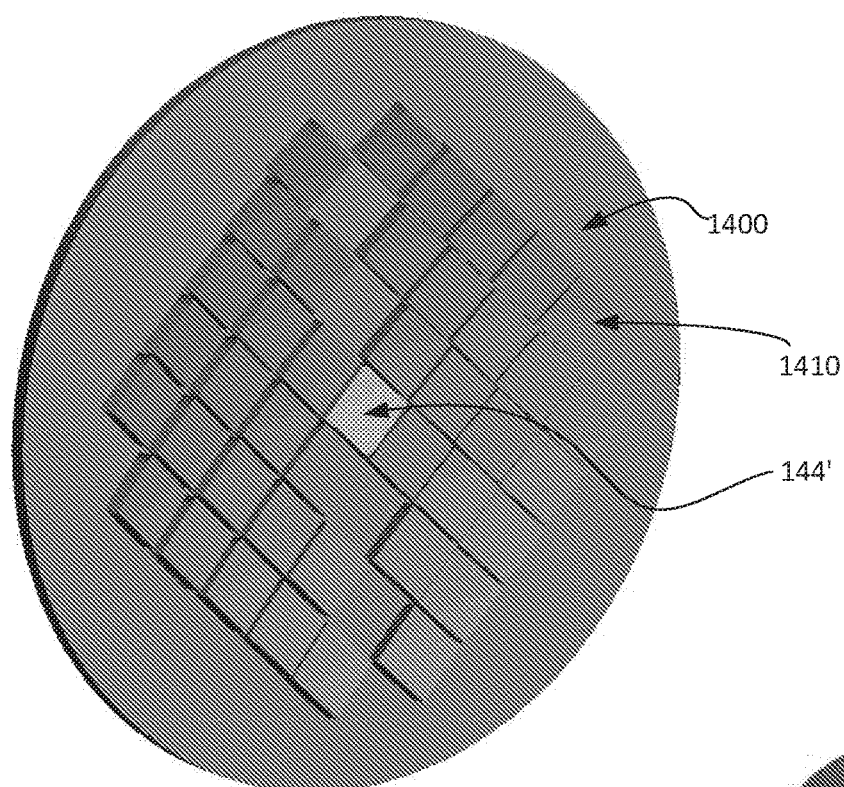
FIGS. 14A, 14B are schematic illustrations of related embodiments of the elements of the illumination unit of the example of the 1D EUV system containing a spatially-curved reticle or pattern-source.
Figure 14B:
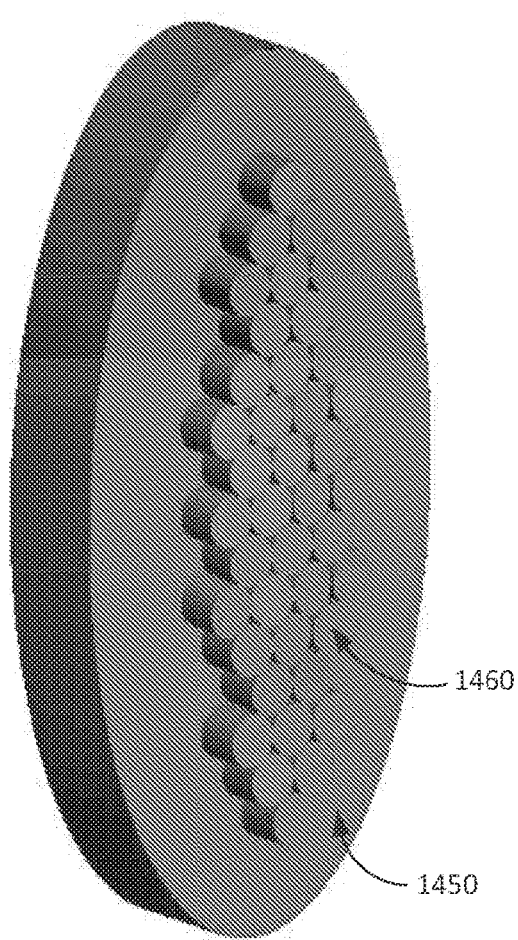

To this end, and in reference to FIGS. 14A, 14B, in one specific design of the optical train of the 1D EUV system contains a curved pattern-source disposed among the individual reflective elements of the first reflector of the IU 1400, in which case the radiation received by the reflector 1400 from the radiation source 126 is transferred to the reflector array 1450 (which is substantially identical to the reflector 800 and which, in turn, relays the radiation to the pattern-source 144' directly, without any relay reflector element 126 present in the system when the pattern source is substantially flat). In the specific design of FIGS. 14A, 14B about forty reflective elements 1410 of the fly's eye array reflector FE1, 1400 are optically imaged onto the pattern-source 144' by about forty reflective elements 1460 (of the fly's eye reflector FE2, 1450) with unit magnification. Elements 1410 of the FE1 are generally configured to have ellipsoidal or spherical surfaces. In one specific implementation, the curved pattern-source 144' may include a 1D phase diffraction grating, be about 20 mm to 30 mm wide (corner-to-corner; in one case—about 25 mm) with a radius of curvature of about 450 mm to 490 mm (in one case—about 473 mm), and have a sag of about 400 microns to 800 microns (in one case—about 660 microns). The individual reflecting elements 1460 of FE2 are spherical with the substantially equal radius of curvature, but are tilted at different angles with respect to a chosen reference so as to place images of the individual elements 1410 onto the pattern-source 144'. A specifically-designed element 1460 has a radius of curvature of about 410 mm to about 430 mm (in one case—about 419 mm) and a diameter of several mm (in one case—of about 2.3 mm) In FIG. 14B, the shape of the reflecting surface of the reflecting elements 1460 may be hexagonal. The plurality of reflective elements 1460 may be formatted as a spatially-closely-packed array.

Figure 15:
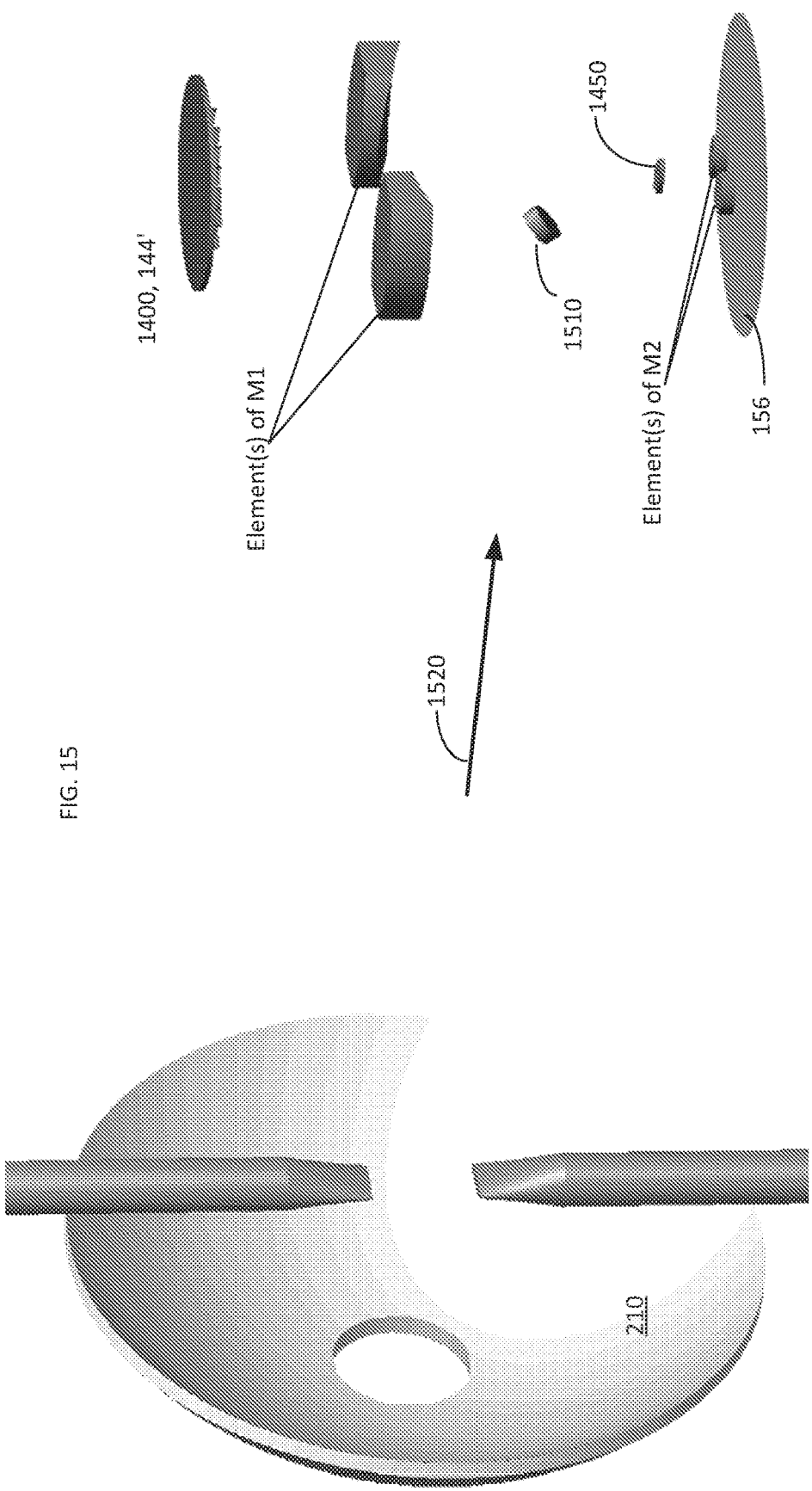
FIG. 15 shows a related embodiment of the overall optical train of the 1D EUV tool, containing a curved reticle or pattern source.

A specific, non-limiting implementation 1500 of the optical train of the 1D EUV system containing a curved pattern-source 144' (disposed in the center of the FE1 reflector array) is shown in FIG. 15. Here, a fold-reflector 1510 is used to relay the EUV radiation flux 1520, received from the EUV radiation source, towards the reflector 1400, which is further reflecting the EUV radiation towards the reflector 1450 that, in turn, images the reflector 1400 onto the pattern-source 144'. The pattern-source 144' projects radiation, by diffracting it, towards the primary reflector M1 of the PO subsystem and further towards the secondary reflector M2, which forms an optical image of the pattern-source 144' on a surface of the workpiece 156. In this design, the reflector 1450 serves the additional purpose of blocking the zeroth order of diffraction of the EUV radiation formed at the pattern-source 144' from propagating towards and into the PO sub-subsystem.

It is appreciated that just as in the case of the embodiment of FIG. 11A, the reflector array 1400 that contains, among its individual reflector elements 1410, the pattern-source 144' is optically-conjugate to the pattern-source 144' (see the optical system of FIG. 15). Therefore, the shape of the individual reflector elements 1410 of the array 1400 is the primary indicator of the shape of the irradiance distribution of the EUV radiation at the pattern-source 144'. When an overall shape of the pattern-source 144' and an individual element 1410 is rhomboidal, exposure of the workpiece 156 to the EUV radiation is offset for each pass of the scanner of the 1D EUV system over the workpiece by half-an-exposure-field, so that each point at the workpiece is exposed twice and receives the same dose of radiation. In so configuring the exposure system and process, the goals is to provide a very uniform dose of radiation across the workpiece, while at the same time maximizing the radiation efficiency of the overall system.

Furthermore, in reference to FIG. 15, it is understood that the preferred location of the FE2 reflector array 1450 may be on the axis of the system. The substrate supporting the FE2 reflector array may be a substantially-planar substrate or a spatially-curved substrate in a related embodiment. Generally, the curved pattern-source or reticle 144' may be arranged on the optical axis or off-axis of the system. While the schematic of FIG. 15 illustrates that the angle of incidence of radiation 1520 onto the fold-reflector 1510 is substantially different from the normal incidence, in related embodiment, the 1D EUV system can be configured to ensure that flux of radiation 1520 be incident onto the fold reflector 1510 at an angle as close to the normal incidence as possible, to increase the reflectance within the specified range of wavelengths. In yet another related embodiment, if required, the 1D EUV system may be configured such that the incidence of the radiation 1520 onto the fold-reflector 1510 is substantially grazing incidence. In yet another related embodiment, the 1D EUV system can be configured to avoid the use of the fold-reflector and to deliver the radiation from the EUV source directly onto the FE1 reflector 1400 array.

Overall, it is understood that radiation relayed by a substantially 1D pattern of the pattern-source 144, 144' (such as a diffraction grating pattern) is projected onto the image plane (surface of the workpiece 156) by an embodiment of the PO objective (such as that discussed in PCT/US2018/027785). In this embodiment (referring to the specific designs illustrated in FIGS. 7A, 7B, 8, 10A, 10B, 14A, 14B), generally the spatial extent FE1-D of the FE1 arrayed reflector, composed of rhomboidal sub-apertures with a side of about 14 mm, is in the range between about 220 and 270 mm (in one implementation—about 240 mm);

the spatial extents FE2-D and FE2-d of the corresponding FE2 arrayed reflector are between about 60 mm and 85 mm along the major axis of the "leaf" of the reflector and between about 20 mm and 30 mm along the minor axis of the "leaf", respectively. (In one implementation—about 78 mm and 25 mm, respectively). In this example, the extent of an individual hexagonal reflector element 810 of the FE2 arrayed reflector is about 3 mm; and the concave relay reflector 126 has a radius of curvature between about 1900 mm and about 2300 mm (in a specific example about 2190 mm), a major axis diameter between about 140 and 180 mm (in a specific example about 160 mm), and a minor axis diameter between about 65 mm and 85 mm (in a specific example—about 75 mm).

In one embodiment, the overall length of the system, measured from the vertex of the collector 210 to the location of the image plane 156 is about 3 m.

In one embodiment, the power requirement for the secondary source of light 216 was estimated to be about 51 W based on the assumptions of a) about 65% reflectance on each of the 6 reflectors of the optical system—FE1, FE2, relay mirror, reticle with a 1D pattern, and primary and secondary mirrors of the PO sub-system; b) a 30 mJ/cm² resist at a workpiece/substrate at the image plane; c) an 85% geometric efficiency of the IU; d) a 25% diffraction efficiency of the grating of the 1D pattern of the reticle; e) a 100 workpiece per hour throughput of the 1D EUVD exposure system; and f) a 10 seconds-per-workpiece or wafer acceleration and overhead.

Figure 12A:
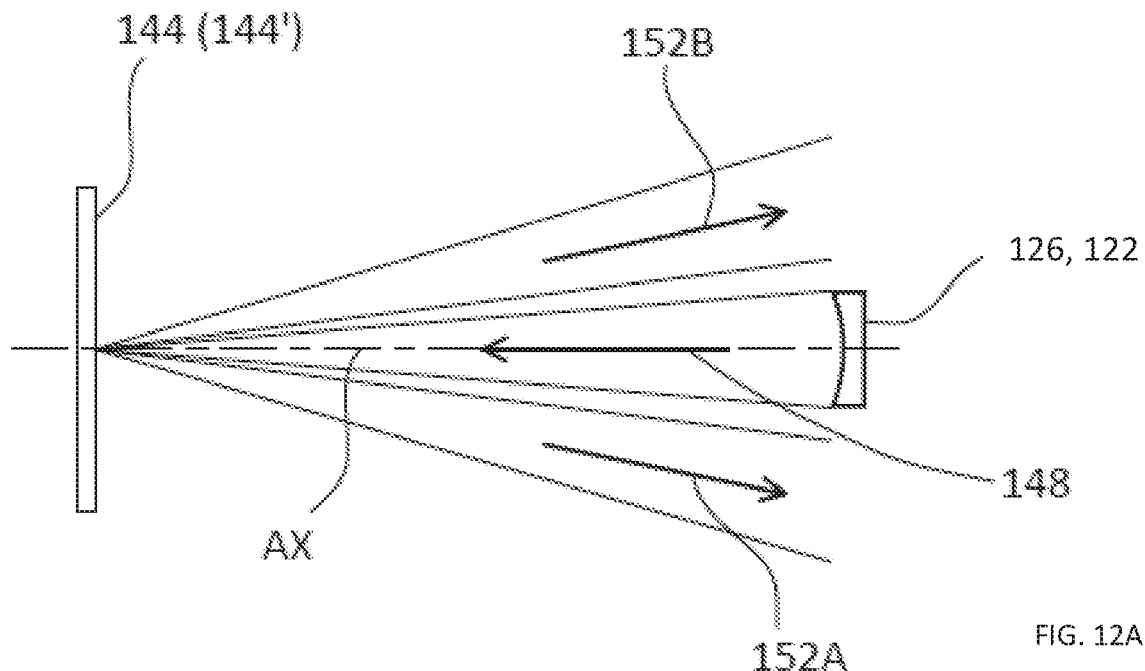
FIGS. 12A, 12B are diagrams complementing each of FIGS. 1B, 1C and illustrating the spatial coordination of the EUV beam, incident onto the pattern-source (reticle) of the 1D EUV system from the last-in-line reflector of the IU of the 1D EUV system, and first and second diffracted beam representing different diffraction orders formed at the pattern-source as a result of diffraction of the incident EUV beam thereon. The last-in-line reflector of the IU may be a relay mirror (which is a third reflector in a three-reflector embodiment of the IU shown in FIG. 1B, in case when the pattern-source is substantially flat, for example) or a second reflector of the IU (in a two-reflector embodiment of the IU shown in FIG. 1C, in case when the pattern-source is spatially curved, for example)
Figure 12B:
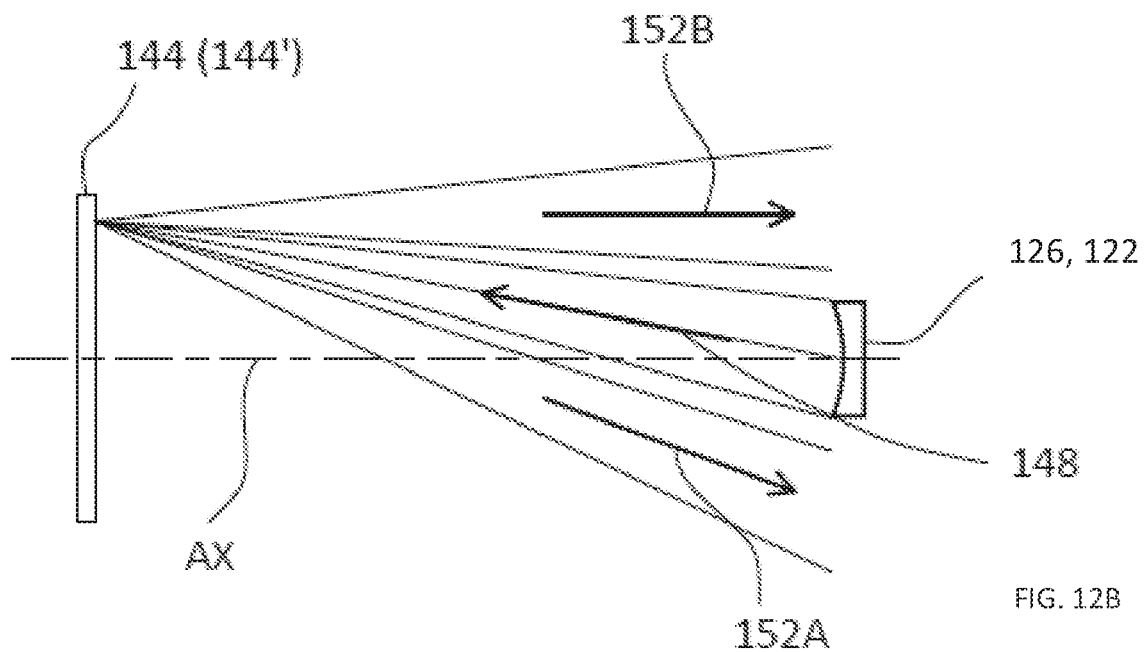

Referring again to FIGS. 11B, 11A, 15 and in further reference to FIGS. 12A, 12B the beam 148 of EUV radiation from the radiation source that is delivered to either an axial point of the pattern source 144, 144' (that is, a point of the pattern source 144, 144' that lies on the optical axis AX, see FIG. 12A) or an off-axis point of the pattern-source 144, 144' (see FIG. 12B) by the last reflector in the sequence of reflectors present in given embodiment of the IU. (In the embodiment employing the flat pattern-source 144, such last reflector in the sequence is typically a relay mirror 126, while in the embodiment employing the curved pattern-source 144' such last reflector is typically a second fly's eye reflector 122). Then the radiation is diffracted at the substantially 1D pattern of the pattern-source 144, 144' to form two diffracted beams 152A, 152B that propagate on opposite sides of the beam 148. (In other words, the beam of EUV radiation incident from the last reflector of the IU unit onto the pattern-source propagates between the two diffracted beams formed at the pattern-source as a result of diffraction of such incident beam on the substantially 1D pattern of the pattern-source.)

Referring now to FIGS. 15, 17A, 17B, 17C, and 17D, FIG. 17A-17D illustrate a portion of the embodiment of the 1D EUV system showing the IU containing the first and second FE reflector arrays FE1, FE2; the pattern-source 144' containing the substantially 1D pattern on a curved surface; and the PO sub-system including reflector elements of M1 and M2. Here, FIG. 17A illustrates the optical path of EUV radiation from the FE2 reflector array to the curved reticle 144'; FIG. 17B shows the optical path of EUV radiation from the FE1 reflector array to the mirror M1 of the PO sub-system via the curved reticle 144'; FIG. 17C shows the optical path of radiation from the FE1 reflector array to the image plane at the workpiece 156 (here, only the chief ray is shown in the optical path from FE1 to the curved reticle 144'); and FIG. 17D shows the optical path of radiation from the curved reticle 144' to the image plane 156. These optical path diagrams are presented in a plane that is parallel to a plane in which beams of EUV radiation diffracted at the curved reticle 144' propagate.

A skilled artisan will readily appreciate, therefore, that disclosed embodiment(s) of the IU and the 1D EUV lithographic system employing such IU represent an overall catoptric system that is configured to be used in conjunction with a spatially-curved reflective pattern-source carrying a substantially one-dimensional pattern thereon:

When a single source of EUV radiation is used, such catoptric IU system includes a combination of only two (and no more) optical reflectors disposed sequentially with respect to one another to transfer an EUV radiation incident on a first optical component (from these only three optical components) onto the pattern-source. The first optical reflector is a first fly's eye array of constituent individual reflecting elements. The second optical reflector is another, second fly's eye reflector array of constituent individual reflecting elements that, in operation, receives the EUV radiation from the first fly's eye reflector. Each of these only two optical reflectors has a corresponding non-zero optical power. Such combination the only three reflectors is disposed in a substantially fixed spatial and optical relationship with respect to the pattern-source. (The grouping of the optical elements that includes both the combination of the only two optical components and the pattern-source also forms and defines yet another catoptric system.) The catoptric IU represents an illumination unit of a 1D EUV exposure tool, which tool includes a projection optic sub-system having a reference axis and configured to form an optical image of the flat pattern-source with a reduction factor N>1 on an image plane that is optically-conjugate to the pattern-source and with the use of only two beams of radiation. Such only two beams of radiation originate at the spatially-curved pattern-source when the EUV radiation is transferred onto it through the IU. The PO sub-system complementing the IU is a catoptric PO sub-system including only a primary reflector and a secondary reflector. At least one of the only two optical components of the IU includes a fly's eye (FE) reflector. In one embodiment, the pattern-source is positioned among (is at least partially surrounded by) constituent individual reflective elements of such FE reflector. The pattern-source may include a phase-shift mask.

Figure 13A:
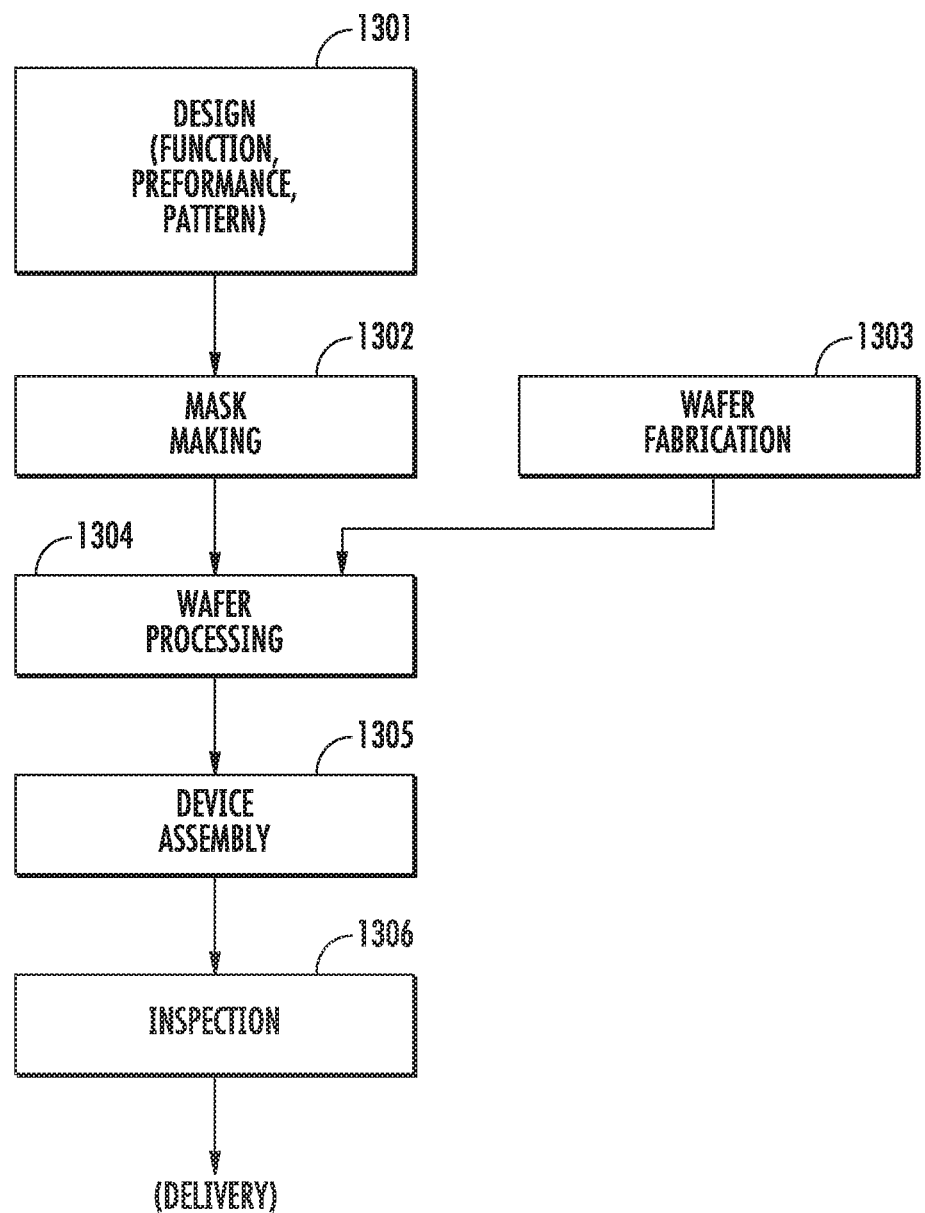
FIGS. 13A, 13B present flow charts outlining a process for manufacturing a device with the use of disclosed embodiment(s)

Further, the above described systems can be employed to fabricate a semiconductor device with the process illustrated schematically in FIG. 13A. In step 1301 the device's function and performance characteristics are devised. Next, in step 1302, a mask (reticle) having a substantially 1D pattern (as discussed above) is designed according to the previous designing step 1301, and in a parallel step 1303 a workpiece is made from a silicon material. The mask pattern formed according to the results of step 1302 is exposed to illuminating radiation and an image of this pattern is transferred onto and formed in the workpiece, in step 1304, with the use of a photolithography system that employs the 1D EUV optics discussed above. In step 1305, the semiconductor device is assembled (including the dicing process, bonding process and packaging process), finally, the device is then inspected in step 1306.

Figure 13B:
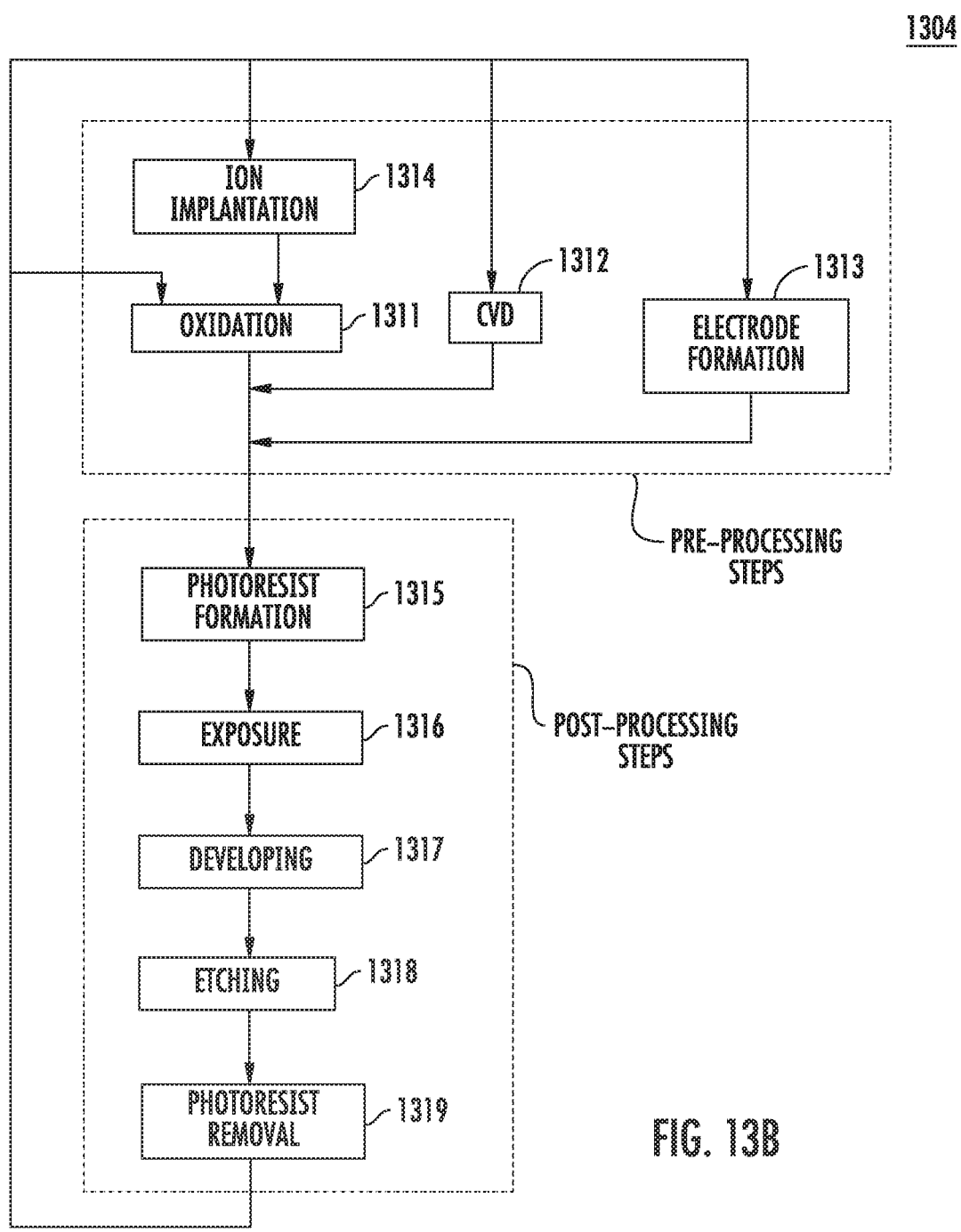

FIG. 13B provides an example of a detailed flowchart detailing the above-mentioned step 1304. As shown, at step 1311 (oxidation step), the workpiece surface is oxidized. In step 1312 (CVD step), an insulation film is formed on the workpiece surface. In step 1313 (electrode formation step), electrodes are formed on the workpiece with the use of vapor deposition. In step 1314 (ion implantation step), ions are implanted into the body of the workpiece. The above-mentioned steps 1311 through 1314 form the preprocessing steps for workpieces during workpiece-processing, and selection of operational parameters is made at each step according to processing requirements.

At each stage of workpiece-processing, when the above-mentioned preprocessing steps have been completed, the following post-processing steps may be implemented. During post-processing, first, in step 1315 (photoresist formation step), photoresist is applied to a workpiece. Next, in step 1316 (exposure step), the above-mentioned exposure device is used to transfer the circuit pattern of a mask (reticle) to the workpiece. Then in step 1317 (developing step), the exposed workpiece is developed, and in step 1318 (etching step), parts other than residual photoresist (exposed material surface) are removed by etching. In step 1319 (photoresist removal step), unnecessary photoresist remaining after etching is removed. Multiple circuit patterns are formed by repetition of these preprocessing and post-processing steps.

For the purposes of this disclosure and the appended claims, the use of the terms "substantially", "approximately", "about" and similar terms in reference to a descriptor of a value, element, property or characteristic at hand is intended to emphasize that the value, element, property, or characteristic referred to, while not necessarily being exactly as stated, would nevertheless be considered, for practical purposes, as stated by a person of skill in the art. These terms, as applied to a specified characteristic or quality descriptor means "mostly", "mainly", "considerably", "by and large", "essentially", "to great or significant extent", "largely but not necessarily wholly the same" such as to reasonably denote language of approximation and describe the specified characteristic or descriptor so that its scope would be understood by a person of ordinary skill in the art. In one specific case, the terms "approximately", "substantially", and "about", when used in reference to a numerical value, represent a range of plus or minus 20% with respect to the specified value, more preferably plus or minus 10%, even more preferably plus or minus 5%, most preferably plus or minus 2% with respect to the specified value. As a non-limiting example, two values being "substantially equal" to one another implies that the difference between the two values may be within the range of +/−20% of the value itself, preferably within the +/−10% range of the value itself, more preferably within the range of +/−5% of the value itself, and even more preferably within the range of +/−2% or less of the value itself.

The use of these terms in describing a chosen characteristic or concept neither implies nor provides any basis for indefiniteness and for adding a numerical limitation to the specified characteristic or descriptor. As understood by a skilled artisan, the practical deviation of the exact value or characteristic of such value, element, or property from that stated falls and may vary within a numerical range defined by an experimental measurement error that is typical when using a measurement method accepted in the art for such purposes.

For example, a reference to an identified vector or line or plane being substantially parallel to a referenced line or plane is to be construed as such a vector or line or plane that is the same as or very close to that of the referenced line or plane (with angular deviations from the referenced line or plane that are considered to be practically typical in related art, for example between zero and fifteen degrees, preferably between zero and ten degrees, more preferably between zero and 5 degrees, even more preferably between zero and 2 degrees, and most preferably between zero and 1 degree). For example, a reference to an identified vector or line or plane being substantially perpendicular to a referenced line or plane is to be construed as such a vector or line or plane the normal to the surface of which lies at or very close to the referenced line or plane (with angular deviations from the referenced line or plane that are considered to be practically typical in related art, for example between zero and fifteen degrees, preferably between zero and ten degrees, more preferably between zero and 5 degrees, even more preferably between zero and 2 degrees, and most preferably between zero and 1 degree). As an example, the use of the terms "substantially flat" or "planar" in reference to the specified surface implies that such surface may possess a degree of non-flatness and/or roughness that is sized and expressed as commonly understood by a skilled artisan in the specific situation at hand.

Other specific examples of the meaning of the terms "substantially", "about", and/or "approximately" as applied to different practical situations may have been provided elsewhere in this disclosure.

An embodiment of the system generally includes electronic circuitry (for example, a computer processor) controlled by instructions stored in a memory, to perform specific data collection/processing and calculation steps as disclosed above. The memory may be random access memory (RAM), read-only memory (ROM), flash memory or any other memory, or combination thereof, suitable for storing control software or other instructions and data. Those skilled in the art should would readily appreciate that instructions or programs defining the operation of the present embodiment(s) may be delivered to a processor in many forms, including, but not limited to, information permanently stored on non-writable storage media (e.g. read-only memory devices within a computer, such as ROM, or devices readable by a computer I/O attachment, such as CD-ROM or DVD disks), information alterably stored on writable storage media (e.g. floppy disks, removable flash memory and hard drives) or information conveyed to a computer through communication media, including wired or wireless computer networks. In addition, while the invention may be embodied in software, the functions necessary to implement a method of the invention may optionally or alternatively be embodied in part or in whole using firmware and/or hardware components, such as combinatorial logic, Application Specific Integrated Circuits (ASICs), Field-Programmable Gate Arrays (FPGAs) or other hardware or some combination of hardware, software and/or firmware components.

The scope of invention, as recited in claims appended to this disclosure, is intended to be assessed in light of the disclosure as a whole. Various changes in the details, steps and components that have been described may be made by those skilled in the art within the principles and scope of the invention.

Modifications to, and variations of, the illustrated embodiments may be made without departing from the disclosed inventive concepts. Furthermore, disclosed aspects, or portions of these aspects, may be combined in ways not listed above. Accordingly, the invention should not be viewed as being limited to the disclosed embodiment(s).

Disclosed aspects, or portions of these aspects, may be combined in ways not listed above. Accordingly, the invention should not be viewed as being limited to the disclosed embodiment(s).

What is claimed is:

1. A catoptric system having a reference axis, the system used with a reflective pattern-source carrying a substantially one-dimensional (1D) pattern thereon, the system comprising:
   a combination of only two reflective optical components disposed optically-sequentially with respect to one another to transfer EUV radiation onto the pattern-source,
   each of the two optical components having a non-zero optical power,
   the combination disposed in a substantially fixed spatial and optical relationship with respect to the pattern-source;
   wherein the combination represents an illumination unit (IU) of an EUV exposure tool configured to form an optical image of the pattern-source with a reduction factor N>1 on an image plane that is optically-conjugate to the pattern-source and with use of only two beams of radiation,
   the only two beams of radiation originating at the pattern-source from the EUV radiation transferred onto it,
   wherein the 1D pattern has a first spatial frequency, the optical image of the pattern-source has a second spatial frequency, and wherein the EUV exposure tool is configured to ensure that the second spatial frequency is at least twice the first spatial frequency.

2. The catoptric system according to claim 1, wherein at least one of the two optical components includes a fly's eye (FE) reflector containing an array of individual reflective elements.

3. The catoptric system according to claim 2, wherein the individual reflective elements of the one of the only two reflective optical components have rhomboidal shapes.

4. The catoptric system according to claim 1, wherein the pattern-source is positioned among constituent individual reflective elements of one of the only two reflective optical components.

5. The catoptric system according to claim 1, wherein the pattern-source includes a phase-shift mask.

6. The EUV exposure tool containing a catoptric system according to claim 1, the catoptric system being configured as the IU of the EUV exposure tool.

7. The EUV exposure tool according to claim 6, further comprising a workpiece positioned at the image plane and configured to be moveable transversely with response to the reference axis.

8. The catoptric system according to claim 1, wherein the pattern-source is characterized by a non-zero optical power.

9. A lithographic exposure tool having an optical train positioned to deliver extreme ultraviolet (EUV) radiation to a target workpiece, the optical train used with a reflective pattern-source and comprising:
 a catoptric illumination unit (IU) containing two reflectors, and
 a catoptric projection optic (PO) sub-system having a reference axis and positioned to receive the first and second diffracted beams from the pattern source and form an optical image of the pattern-source with a reduction factor N>1 at an image plane that is optically-conjugate with the pattern-source, with the use of only the first and second diffracted beams,
 wherein the reflective pattern-source defines a substantially one-dimensional (1D) pattern thereon and configured to receive the EUV radiation delivered thereto through the catoptric IU and diffract the EUV radiation at the substantially 1D pattern to form first and second diffracted beams of the EUV radiation, wherein the substantially 1D pattern is disposed in a spatially-curved surface and wherein the substantially 1D pattern has a first spatial frequency, the optical image of the pattern-source has a second spatial frequency, and the second spatial frequency is at least twice the first spatial frequency.

10. The lithographic exposure tool according to claim 9, wherein the catoptric IU contains only two reflectors.

11. The lithographic exposure tool according to claim 9, wherein the pattern-source is disposed in a substantially fixed spatial relationship with respect to the catoptric IU and the catoptric PO sub-system.

12. The lithographic exposure tool according to claim 11, wherein the substantially 1D pattern has an outer boundary, wherein first and second contrast values are substantially equal, wherein the first contrast value is a value of optical contrast of a first portion of the image representing the outer boundary, and wherein the second contrast value is a value of optical contrast of a second portion of the image representing a portion of the substantially 1D pattern within the outer boundary.

13. The lithographic exposure tool according to claim 9, wherein the first and second diffracted beams represent respectively-corresponding diffraction orders, formed from the EUV radiation, that have equal absolute values but different signs.

14. The lithographic exposure tool according to claim 9, wherein the optical train is configured to relay the first and second diffracted beams from the pattern-source to a first element of the catoptric PO sub-system and a last element of the catoptric IU is positioned between the first and second diffracted beams such that the first and second diffracted beams are spatially separated from one another by a last element of the catoptric IU without having any of the first and second diffracted beams truncated with the last element of the catoptric IU,
 wherein the last element is a reflector of the catoptric IU with which the EUV radiation interacts upon passing through the catoptric IU before impinging onto the pattern-source.

15. The lithographic exposure tool according to claim 14, wherein the catoptric IU contains only two reflectors;
 wherein a first reflector of the only two reflectors of the catoptric IU is a first fly's eye (FE) reflector, wherein a second reflector of the only two reflectors of the catoptric IU is a second FE reflector, each of the first and second FE reflectors containing a respectively-corresponding array of individual constituent reflecting elements, the first FE reflector positioned to image a distribution of the EUV radiation from an entrance pupil of the catoptric IU to the second FE reflector, and
 wherein the last element of the catoptric IU is the second FE reflector.

16. The lithographic exposure tool according to claim 15, wherein the catoptric PO sub-system includes a primary mirror and a secondary mirror, and
 wherein the second FE reflector is positioned to block a zero-order diffracted beam, formed as a result of diffraction of the EUV radiation delivered through the catoptric IU at the pattern-source, from reaching the primary mirror.

17. The lithographic exposure tool according to claim 15, wherein each of the only two reflectors includes a fly's eye (FE) reflector array of constituent individual reflecting elements, and wherein each of constituent individual reflecting elements of a first FE reflector array has a reflecting surface that is either ellipsoidal or spherical.

18. The lithographic exposure tool according to claim 17,
 wherein the pattern-source carries a 1D diffraction grating thereon, a surface of the 1D diffraction grating being curved;
 wherein the pattern-source, a second FE reflector array, and first and second mirrors of the catoptric PO sub-system are disposed symmetrically about the reference axis;
 wherein first and second beams, representing the EUV radiation reflected by the second FE reflector array and then diffracted on the 1D diffraction grating into diffraction orders of the same absolute value but opposite signs, are transferred to the first mirror of the catoptric PO sub-system on opposite sides of the second FE reflector array while not impinging on the second FE reflector array.

19. The lithographic exposure tool according to claim 18, wherein a third beam, representing a zeroth-order diffraction of light on the 1D diffraction grating, is blocked by the second FE reflector array from reaching a plane located on an opposite side of the second FE reflector array with respect to the first FE reflector array.

20. The lithographic exposure tool according to claim 17, wherein the pattern-source carries a one-dimensional (1D) diffraction grating, and wherein individual constituent reflecting elements of the first FE reflector array have curved reflecting surfaces.

21. The lithographic exposure tool according to claim 20, wherein reflecting surfaces of individual constituent reflecting elements of the second FE reflector array are spherical reflecting surfaces.

22. The lithographic exposure tool according to claim 9,
 wherein a chosen reflector of the catoptric IU is positioned to block a third beam of EUV radiation from propagating to a surface located between the chosen reflector and a first optical element of the catoptric PO sub-system,
 wherein the third beam represents a zeroth-order of diffraction, of the EUV radiation, formed at the pattern-source.

23. The lithographic exposure tool according to claim 22, wherein the catoptric IU includes a fly's eye (FE) reflector containing an array of individual constituent reflecting elements, and wherein the FE reflector is the chosen reflector of the catoptric IU.

24. The lithographic exposure tool according to claim 23, wherein first and second optical axes of first and second individual constituent reflecting elements of the second FE reflector array are not parallel to one another.

25. The lithographic exposure tool according to claim 9, wherein the PO sub-system includes primary and secondary mirrors,
wherein at least one of the primary and secondary mirrors contains two identically-shaped reflecting elements spatially disconnected from one another.

26. The lithographic exposure tool according to claim 25, wherein a reflecting surface of any of first and second of the two identical reflecting elements is a section of a rotationally-symmetric surface.

27. The lithographic exposure tool according to claim 9, wherein the substantially 1D pattern forms a one-dimensional (1D) diffraction grating that is configured as one of (i) a phase diffraction grating; (ii) an amplitude diffraction grating; and (iii) an attenuated phase shift diffraction grating.

28. The lithographic exposure tool according to claim 9, wherein the pattern-source includes a surface having a first finite radius of curvature defined in a first plane that is transverse to the surface.

29. The lithographic exposure tool according to claim 28, wherein the surface has a second finite radius of curvature defined in a second plane that is transverse to both the surface and the first plane.

30. The lithographic exposure tool according to claim 9, wherein the catoptric PO sub-system includes two pairs of reflecting elements,
wherein the first pair of the reflecting elements is disposed to receive the EUV radiation that has been reflected by the pattern-source and to reflect the EUV radiation towards the second pair of the reflecting elements,
wherein the second pair of the reflecting elements is configured to transfer the EUV radiation, received from the first pair, in a spatially-converging fashion between reflecting elements of the first pair to form the optical image of the pattern source,
wherein the image plane is separated from the second pair by the first pair.

31. The lithographic exposure tool according to claim 9, further comprising a source of the EUV radiation, the source of the EUV radiation including one of a laser-driven plasma source of light, a discharge-driven plasma source of light, a free-electron laser, and a synchrotron-based source of light.

32. A lithographic exposure tool having an optical train positioned to deliver an EUV radiation, entering the optical train, through the optical train to a target workpiece, the optical train used with a reflective pattern-source, and the optical train comprising:
a catoptric illumination unit (IU);
a catoptric projection optic (PO) sub-system positioned to receive diffracted beams from the pattern-source and form an optical image of the pattern-source with a reduction factor N>1 at an image plane that is optically-conjugate with the pattern-source; and
an element opaque to the EUV radiation and disposed between the reflective pattern-source and the primary mirror to block a diffracted beam, which represents a zeroth-order diffraction at the reflective pattern-source, from reaching a surface disposed between the element opaque to the EUV radiation and a reflector of the PO sub-system,
wherein the reflective pattern-source configured to receive the EUV radiation from the catoptric IU and to diffract the EUV radiation to form diffracted beams thereof, the reflective pattern source carrying thereon a substantially one-dimensional (1D) pattern disposed on a spatially-curved surface, wherein the substantially 1D pattern has a first spatial frequency, the optical image has a second spatial frequency, and the second spatial frequency is at least twice the first spatial frequency.

33. The lithographic exposure tool according to claim 32, wherein the catoptric IU contains only two reflectors including first and second reflectors.

34. The lithographic exposure tool according to claim 33, wherein the first reflector is a first fly's eye (FE) reflector array that includes individual constituent reflecting elements.

35. The lithographic exposure tool according to claim 34, wherein the pattern-source is disposed among individual constituent reflecting elements of the first FE reflector array.

36. The lithographic exposure tool according to claim 34, wherein each of constituent individual reflecting elements of the first FE reflector array has a reflecting surface that is either ellipsoidal or spherical.

37. The lithographic exposure tool according to claim 33, wherein the second reflector of the IU includes a second FE reflector array including individual constituent reflecting elements.

38. The lithographic exposure tool according to claim 32, wherein a reflector of the catoptric IU is configured as the opaque element.

39. The lithographic exposure tool according to claim 32, wherein the pattern-source is positioned to form an image of a second reflector of the catoptric IU at an entrance pupil of the catoptric PO sub-system.

40. The lithographic exposure tool according to claim 32, wherein the pattern-source is disposed in a substantially fixed spatial relationship with respect to the catoptric IU and the catoptric PO sub-system.

41. The lithographic exposure tool according to claim 32, wherein at least one of reflector systems of the catoptric PO sub-system includes two identical reflecting elements disconnected from one another.

42. The lithographic exposure tool according to claim 41, wherein a reflecting surface of any of first and second of the two identical reflecting elements is a section of a rotationally-symmetric surface.

43. A lithographic exposure tool configured to irradiate a workpiece with extreme ultraviolet (EUV) radiation, the tool used with a reflective pattern-source carrying a substantially one-dimensional (1D) pattern thereon, the substantially 1D pattern disposed in a curved surface, the tool comprising:
a catoptric illumination unit (IU) having an optical axis and configured to receive EUV radiation and to irradiate the reflective pattern source with the EUV radiation, the catoptric IU including a plurality of optical surfaces at the pupil of the IU; and
a projection optical (PO) system disposed to form an optical image of the reflective pattern-source on a surface of the workpiece,
wherein, the plurality of optical surfaces are oriented such that, in operation of the tool, a first beam of EUV radiation reflected from a first surface of the plurality is directed to the reflective pattern source and diverges from the optical axis upon propagation towards the reflective pattern source, while a second beam of the EUV radiation reflected from a second surface of the plurality is directed to the reflective pattern source and approaches the optical axis upon propagation towards the reflective pattern source, and wherein the catoptric IU includes only two fly's eye (FE) reflector arrays, while the PO system is configured to form the image that contains a spatial frequency that is at least twice a spatial frequency of the substantially 1D pattern.

44. The lithographic exposure tool according to claim 43, wherein the PO system is a catoptric system including a primary mirror and a secondary minor, and wherein one of the only two FE reflector arrays is positioned to block a zero-order diffracted beam, formed as a result of diffraction of the EUV radiation delivered through the IU at the pattern-source, from reaching the primary minor.

45. The lithographic exposure tool according to claim 43, wherein the PO system includes two pairs of reflecting elements, wherein the first pair of the reflecting elements is disposed to receive the EUV radiation that has been reflected by the reflective pattern-source and to reflect the EUV radiation towards the second pair of the reflecting elements, wherein the second pair of the reflecting elements is configured to transfer the EUV radiation, received from the first pair, in a spatially-converging fashion between reflecting elements of the first pair to form the optical image, wherein the image plane is separated from the second pair by the first pair.

46. The lithographic exposure tool according to claim 43, wherein first and second optical axes of first and second individual constituent reflecting elements of one of the only two FE reflector arrays are not parallel to one another.

* * * * *